United States Patent
Wiesinger et al.

(10) Patent No.: US 11,550,013 B2
(45) Date of Patent: Jan. 10, 2023

(54) SYSTEMS AND METHODS OF SILENT MULTI-GRADIENT ECHO DYNAMIC MAGNETIC RESONANCE IMAGING

(71) Applicants: GE PRECISION HEALTHCARE LLC, Wauwatosa, WI (US); The Regents of the University of California, Oakland, CA (US)

(72) Inventors: Florian Wiesinger, Freising (DE); Ana Beatriz Solana Sanchez, Munich (DE); Brice Fernandez, Montouge (FR); Peder Larson, Redwood City, CA (US); Andrew Leynes, Baierbrunn (DE)

(73) Assignee: GE PRECISION HEALTHCARE LLC, Wauwatosa, WI (US)

( * ) Notice: Subject to any disclaimer, the term of this patent is extended or adjusted under 35 U.S.C. 154(b) by 147 days.

(21) Appl. No.: 17/038,698

(22) Filed: Sep. 30, 2020

(65) Prior Publication Data
US 2022/0099776 A1    Mar. 31, 2022

(51) Int. Cl.
*G01R 33/561* (2006.01)
*G01R 33/48* (2006.01)
*G01R 33/56* (2006.01)

(52) U.S. Cl.
CPC ..... *G01R 33/5616* (2013.01); *G01R 33/4818* (2013.01); *G01R 33/5608* (2013.01)

(58) Field of Classification Search
CPC ............ G01R 33/4818; G01R 33/5608; G01R 33/5616
See application file for complete search history.

(56) References Cited

U.S. PATENT DOCUMENTS

| 10,088,539 B2 | 10/2018 | Wiesinger et al. |
| 2005/0242810 A1* | 11/2005 | Scheffler ............ G01R 33/5615 324/309 |

OTHER PUBLICATIONS

Zapp J, Schmitter S, Schad LR. Sinusoidal echo-planar imaging with parallel acquisition technique for reduced acoustic noise in auditory fMRI. J Magn Reson Imaging. Sep. 2012;36(3):581-8. doi: 10.1002/jmri.23699. Epub May 14, 2012. PMID: 22585371. Obtained on Apr. 21, 2022. (Year: 2012).*

(Continued)

*Primary Examiner* — Gregory H Curran
(74) *Attorney, Agent, or Firm* — Armstrong Teasdale LLP

(57) ABSTRACT

A magnetic resonance (MR) dynamically imaging method is provided. The method includes acquiring a functional MR dataset including frames of k-space datasets, while a functional stimulus is applied to the subject. Acquiring the functional MR dataset includes, acquiring a frame of k-space datasets by setting an orientation as an initial angle, and acquiring a free induction decay (FID) dataset. Acquiring an FID dataset includes applying a sequence of gradients, each gradient of the sequence corresponding to a k-space spoke, wherein the sequence of k-space spokes define a k-space segment having the orientation in a 3D k-space volume. Acquiring a frame of k-space datasets also includes acquiring a gradient echo dataset corresponding to the FID dataset, and updating the orientation as golden angles. The method also includes generating anatomical MR images and functional images based on the functional MR dataset.

20 Claims, 14 Drawing Sheets
(8 of 14 Drawing Sheet(s) Filed in Color)

(56) References Cited

OTHER PUBLICATIONS

Wiesinger et al. (2019). Looping Star. Magnetic Resonance in Medicine, 81(1), pp. 57-68.
Ong et al., Extreme MRI: Large Scale Volumetric Dynamic Imaging from Continuous Non-Gated Acquisitions. arXiv preprint arXiv: 1909. 13482.
Chan et al., Temporal Stability of Adaptive 3D Rdial MRI using Multidimensional Golden Means, Magnetic Resonance in Medicine 61:354-363, 2009.
Liang et al., Spatiotemporal imaging with partially separable functions. In: Proceedings of the 4th IEEE International Symposium on Biomedical Imaging, 2010, pp. 716-719.
Pedersen et al., k-t PCA: Temporally Constrained -t BLAST Reconstruction Using Principal Component Analysis, Magnetic Resonance Medicine, 2009, 62: pp. 706-716.
Trzasko et al., Local Versus Global Low-Rank Promotion in Dynamic MRI Series Reconstruction, In: Proceedings of the International Society for Magnetic Resonance in Medicine, 2011,19: pp. 4371.
Otazo et al., Low-rank Plus Sparse Matrix Decomposition for Accelerated Dynamic MRI With Separation of Background and Dynamic Components, Magnetic Resonance in Medicine, 2015, 73: pp. 1125-1136.
Robbins et al., A Stochastic Approximation Method, The Annals of Mathematical Statistics, 1951, 22: pp. 400-407.
Haldar et al., Spatiotemporal Imaging With Partially Separable Functions: A Matrix Recovery Approach, Proceedings of the 2010 IEEE International Symposium on Biomedical Imaging, 2010, pp. 716-719.
Lingala et al., Accelerated Dynamic MRI Exploiting Sparsity and Low-Rank Structure: k-t SLR, IEEE Trans Med Imaging, 2011, 30: pp. 1042-1054.

Zhao et al., Image Reconstruction From Highly Undersampled (k, t)-Space Data with Joint Partial Separability and Sparsity Constraints, IEEE Trans Med Imaging, 2012, 31: pp. 1809-1820.
Candes et al. Uncertainty Principles: Exact Signal Reconstruction from Highly Incomplete Frequency Information, IEEE Transactions on Information Theory, 2006, 52: pp. 489-509.
Donoho, Compressed Sensing, IEEE Transactions on Information Theory, 2006 52 pp. 1289-1306.
Fazel, Matrix Rank Minimization with Applications, Ph.D Thesis, Stanford University 2002, 130 pages.
Recht et al., Guaranteed Minimum-Rank Solutions of Linear Matrix Equations via Nuclear Norm Minimization, SLAM Rev., 2010, 52: pp. 471-501.
Candes et al., Exact matrix Completion Via Convex Optimization, Found Comput Math, 2009, 9: pp. 717-772.
Burer et al., A Nonlinear Programming Algorithm for Solving Semidefinite Programs Via Low-Rank Factorization, Math Program, 2003, 95: pp. 329-357.
Hudson et al., Accelerated Image Reconstruction Using Ordered Subsets of Projection Data, IEEE Trans Med Imaging, 1994, 13: pp. 601-609.
Erdogan et al., Ordered subsets algorithms for transmission tomography, Phys Med Biol, 1999, 44: pp. 2835-2851.
Kuethe et al., Transforming NMR data despite missing points. Journal of Magnetic Resonance, 1999, 139(1), pp. 18-25.
Muckley et al., Accelerating SENSE-type MR Image Reconstruction Algorithms with Incremental Gradients, Proceedings of the ISMRM 22nd Annual Meeting, 2014: p. 4400.
Mardani et al., Tracking Tensor Subspaces with Informative Random Sampling for Real-Time MR Imaging, arXiv:1609.04104, 2016, pp. 1-29.

\* cited by examiner

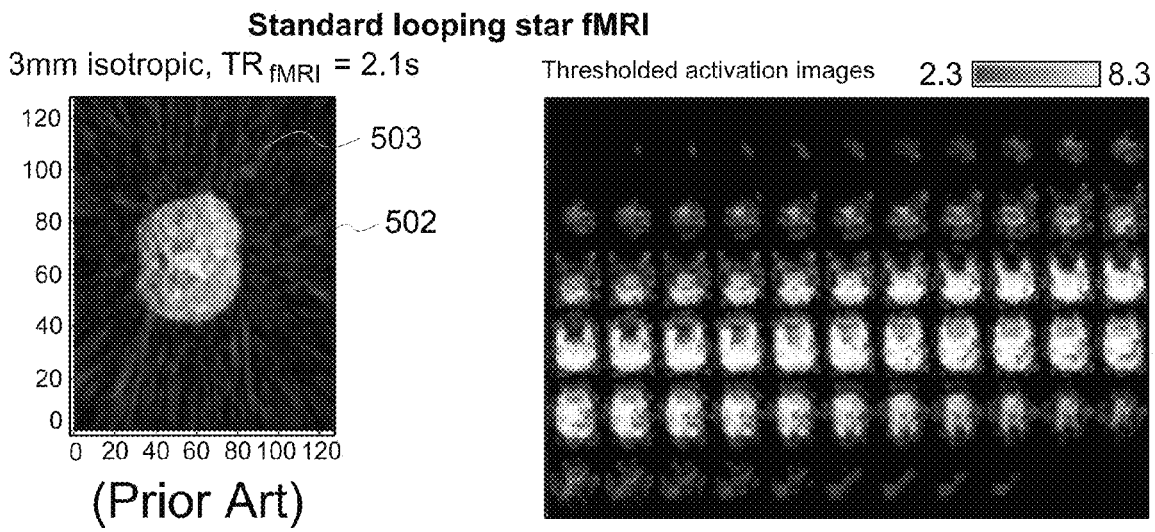
FIG. 5A (Prior Art)
FIG. 5B
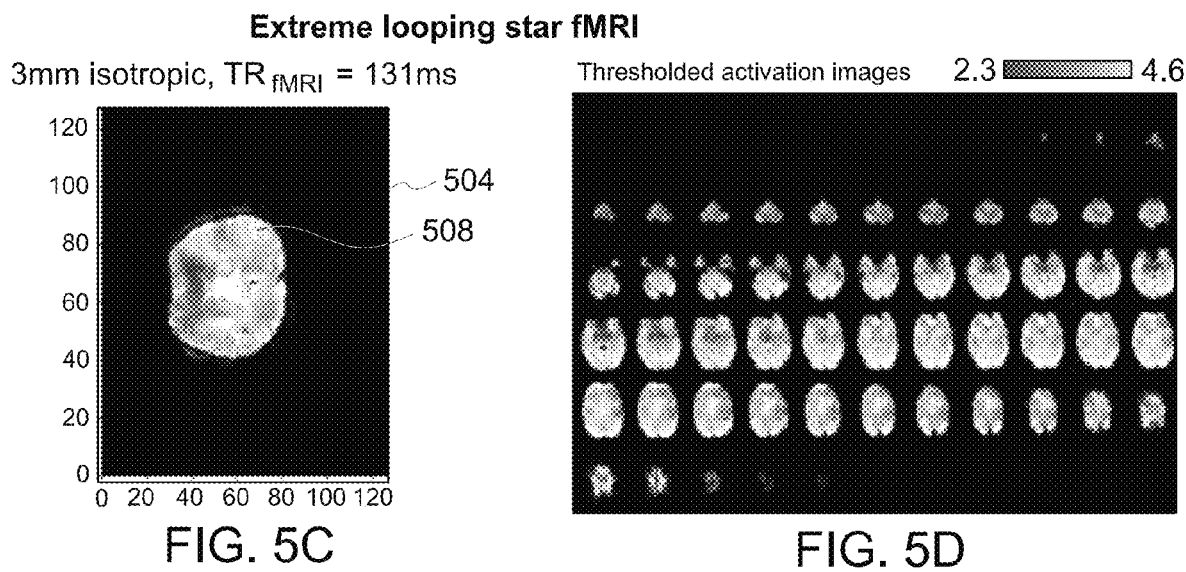
FIG. 5C
FIG. 5D
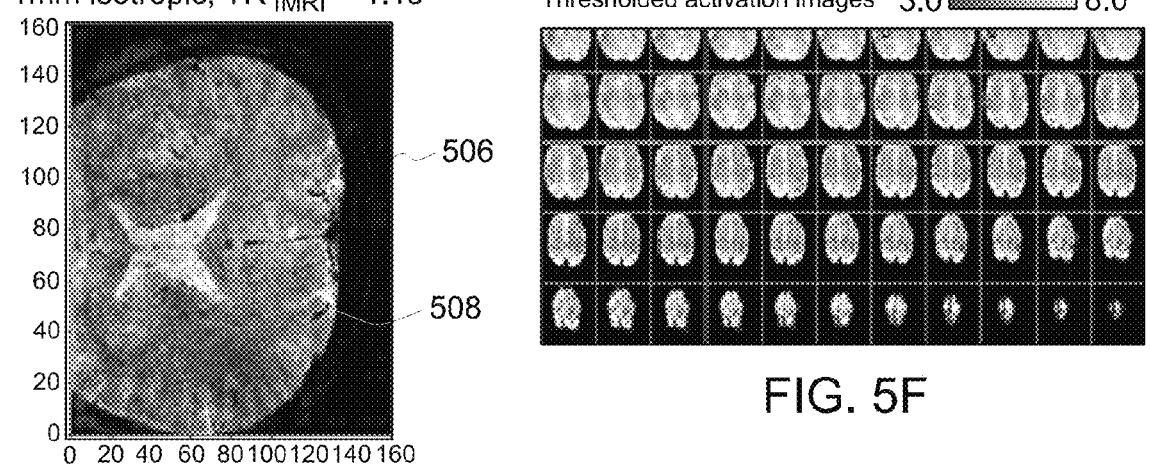
FIG. 5E
FIG. 5F

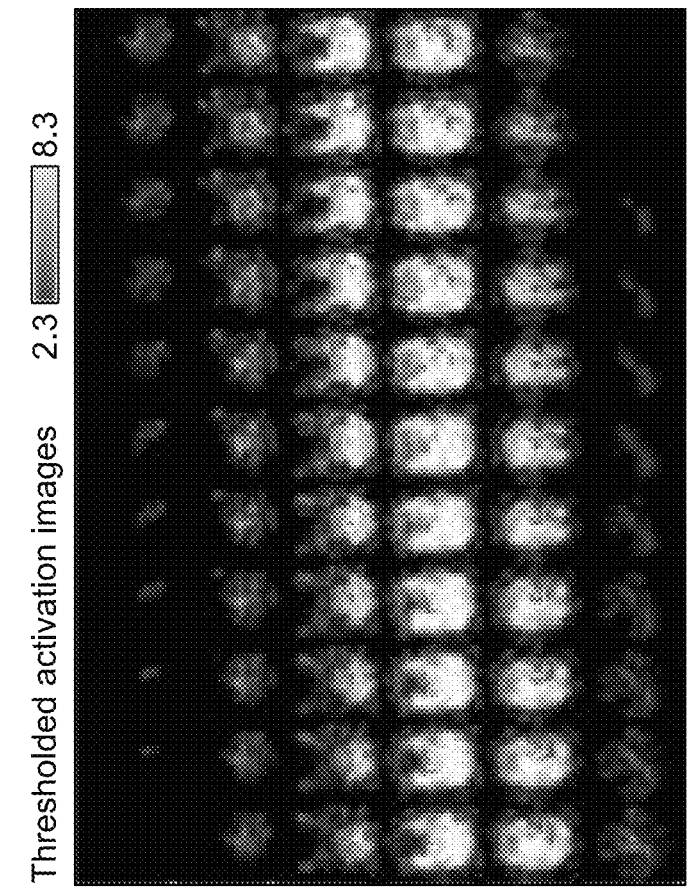
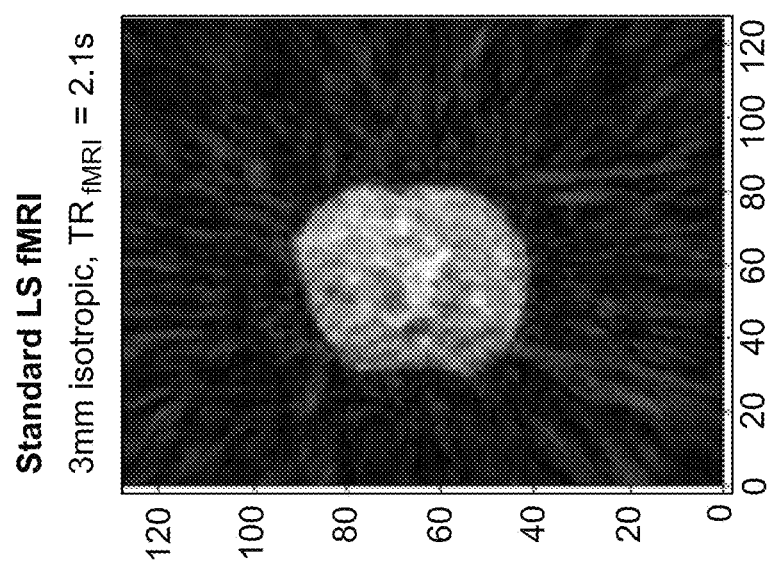
FIG. 6B
FIG. 6A

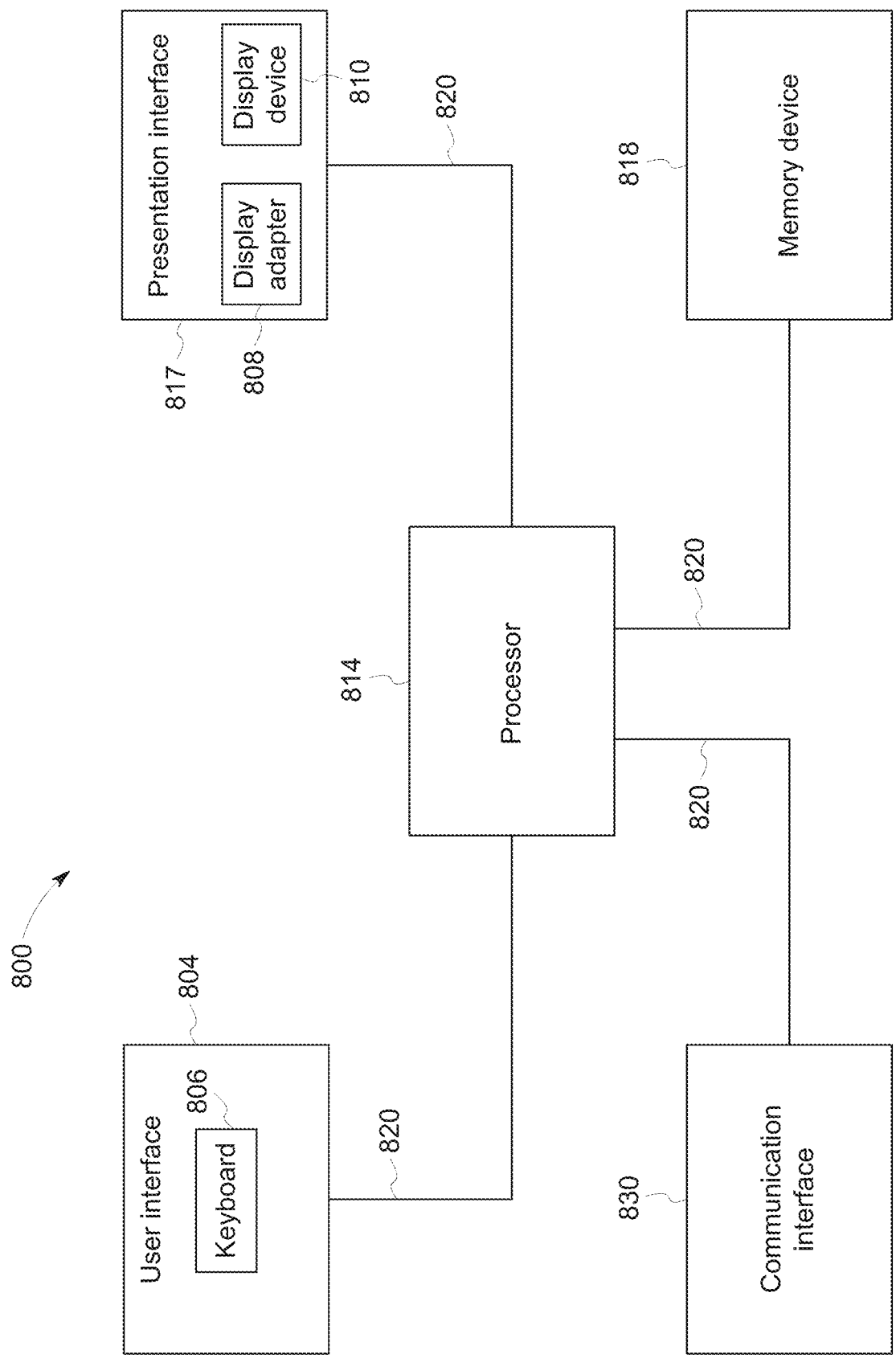

SYSTEMS AND METHODS OF SILENT MULTI-GRADIENT ECHO DYNAMIC MAGNETIC RESONANCE IMAGING

BACKGROUND

The field of the disclosure relates generally to systems and methods of dynamic magnetic resonance (MR) imaging, and more particularly, to systems and methods of silent multi-gradient echo dynamic MR imaging.

Dynamic MR imaging has been used to study temporal responses of a subject. For example, functional MRI (fMRI) has been used to diagnose neural functions of the brain. A typical fMRI data acquisition is loud due to fast switching of magnetic field gradients, preventing the application of fMRI for patients sensitive to loud acoustic noise. In addition, to increase the sampling rate in the temporal direction, functional images have low image resolution. As a result, a separate anatomical scan having a higher image resolution is required to identify the location of the functional activities in the brain. This additional requirement increases the scan time and introduces errors from registering the functional images with the anatomical images.

BRIEF DESCRIPTION

In one aspect, a magnetic resonance (MR) imaging method of dynamically imaging a subject is provided. The method includes acquiring a functional MR dataset of a three-dimensional (3D) k-space volume of the subject including a plurality of frames of k-space datasets, while a functional stimulus is applied to the subject. Acquiring the functional MR dataset includes, for each of a plurality of repetitions, acquiring a frame of a k-space dataset of the 3D k-space volume by setting an orientation as an initial angle, and acquiring a free induction decay (FID) dataset. Acquiring an FID dataset includes applying a sequence of gradients to the subject, each gradient of the sequence of gradients corresponding to a k-space spoke of a sequence of k-space spokes, wherein the sequence of k-space spokes defines a k-space segment having an orientation in the 3D k-space volume. Acquiring an FID dataset also includes applying one or more radio-frequency (RF) excitation pulses to the subject while the sequence of gradients are applied, and collecting the FID dataset corresponding to an RF emission from the subject immediately following each RF excitation pulse. Acquiring a frame of k-space datasets also includes acquiring a gradient echo dataset corresponding to the FID dataset by re-applying the sequence of gradients to the subject while acquiring echoes of the RF emissions to obtain the gradient echo dataset, and updating the orientation as golden angles along which the k-space segment partitions the 3D k-space volume by golden means. Acquiring a frame of k-space datasets further includes repeating acquiring an FID dataset, acquiring a gradient echo dataset, and updating the orientation until a predetermined condition is met. Acquiring a functional MR dataset has a sound level similar to that of a background noise of the MRI system before imaging. The method also includes generating anatomical MR images and functional images based on the functional MR dataset by generating anatomical images based on one of the plurality of frames of k-space datasets, and generating frames of functional MR images based on the functional MR dataset.

In another aspect, an MR imaging method of dynamically imaging a subject is provided. The method includes acquiring k-space datasets of a 3D k-space volume of the subject including setting an orientation as an initial angle, and acquiring a free induction decay (FID) dataset. Acquiring an FID dataset includes applying a sequence of gradients to the subject, each gradient of the sequence of gradients corresponding to a k-space spoke of a sequence of k-space spokes, wherein the sequence of k-space spokes define a k-space segment having the orientation in the 3D k-space volume. Acquiring an FID dataset also includes applying one or more radio-frequency (RF) excitation pulses to the subject while the sequence of gradients are applied, and collecting the FID dataset corresponding to an RF emission from the subject immediately following each RF excitation pulse. Acquiring a k-space dataset also includes acquiring a gradient echo dataset corresponding to the FID dataset by re-applying the sequence of gradients to the subject while acquiring echoes of the RF emissions to obtain the gradient echo dataset, updating the orientation as golden angles along which the k-space segment partitions the 3D k-space volume by golden means, and repeating acquiring an FID dataset, acquiring a gradient echo dataset, and updating the orientation until a predetermined condition is met.

DRAWINGS

The patent or application file includes at least one drawing executed in color. Copies of this patent or patent application publication with color drawing(s) will be provided by the Office upon request and payment of the necessary fee.

FIG. 5A is an anatomical image based on datasets acquired with a known method.

FIG. 5B is a plot of functional images based on the same datasets for the anatomical image shown in FIG. 5A.

FIG. 5C is an anatomical image based on a functional MR dataset acquired with the method shown in FIG. 2A.

FIG. 5D is a plot of functional images based on the same functional dataset acquired for reconstructing the image shown in FIG. 5C.

FIG. 5E is another anatomical image acquired with the method shown in FIG. 2A and having an increased image resolution than the image shown in FIG. 5C.

FIG. 5F is a plot of functional images based on the same functional dataset acquired for reconstructing the image shown in FIG. 5E.

FIG. 6A is an enlarge view of the image shown in FIG. 5A.

FIG. 6B is an enlarge view of the plot shown in FIG. 5B.

FIG. 7 is a block diagram of an exemplary computing device.

DETAILED DESCRIPTION

The disclosure includes systems and methods of silent dynamic magnetic resonance (MR) imaging of a subject. In dynamic imaging, images of the subject are acquired to study the subject's dynamic changes over time. A subject used herein is an object that is placed inside the bore of an MR imaging (MRI) system and being imaged by the MRI system. The subject may be a human, an animal, or a phantom. Besides being silent, the systems and methods described herein also allow acquisition of multi-gradient echo datasets, which allow adjustments of image contrast. Further, anatomical and functional MR images are generated from the same functional MR dataset, without a separate acquisition of anatomical images. Method aspects will be in part apparent and in part explicitly discussed in the following description.

In magnetic resonance imaging (MRI), a subject is placed in a magnet. When the subject is in the magnetic field generated by the magnet, magnetic moments of nuclei, such as protons, attempt to align with the magnetic field but precess about the magnetic field in a random order at the nuclei's Larmor frequency. The magnetic field of the magnet is referred to as B0 and extends in the longitudinal or z direction. In acquiring an MRI image, a magnetic field (referred to as an excitation field B1), which is in the x-y plane and near the Larmor frequency, is generated by a radio-frequency (RF) coil and may be used to rotate, or "tip," the net magnetic moment Mz of the nuclei from the z direction to the transverse or x-y plane. A signal, which is referred to as an MR signal, is emitted by the nuclei, after the excitation signal B1 is terminated. To use the MR signals to generate an image of a subject, magnetic field gradient pulses (Gx, Gy, and Gz) are used. The gradient pulses are used to scan through the k space, the space of spatial frequencies or inverse of distances. A Fourier relationship exists between the acquired MR signals and an image of the subject, and therefore the image of the subject can be derived by reconstructing the MR signals.

Figure 1:
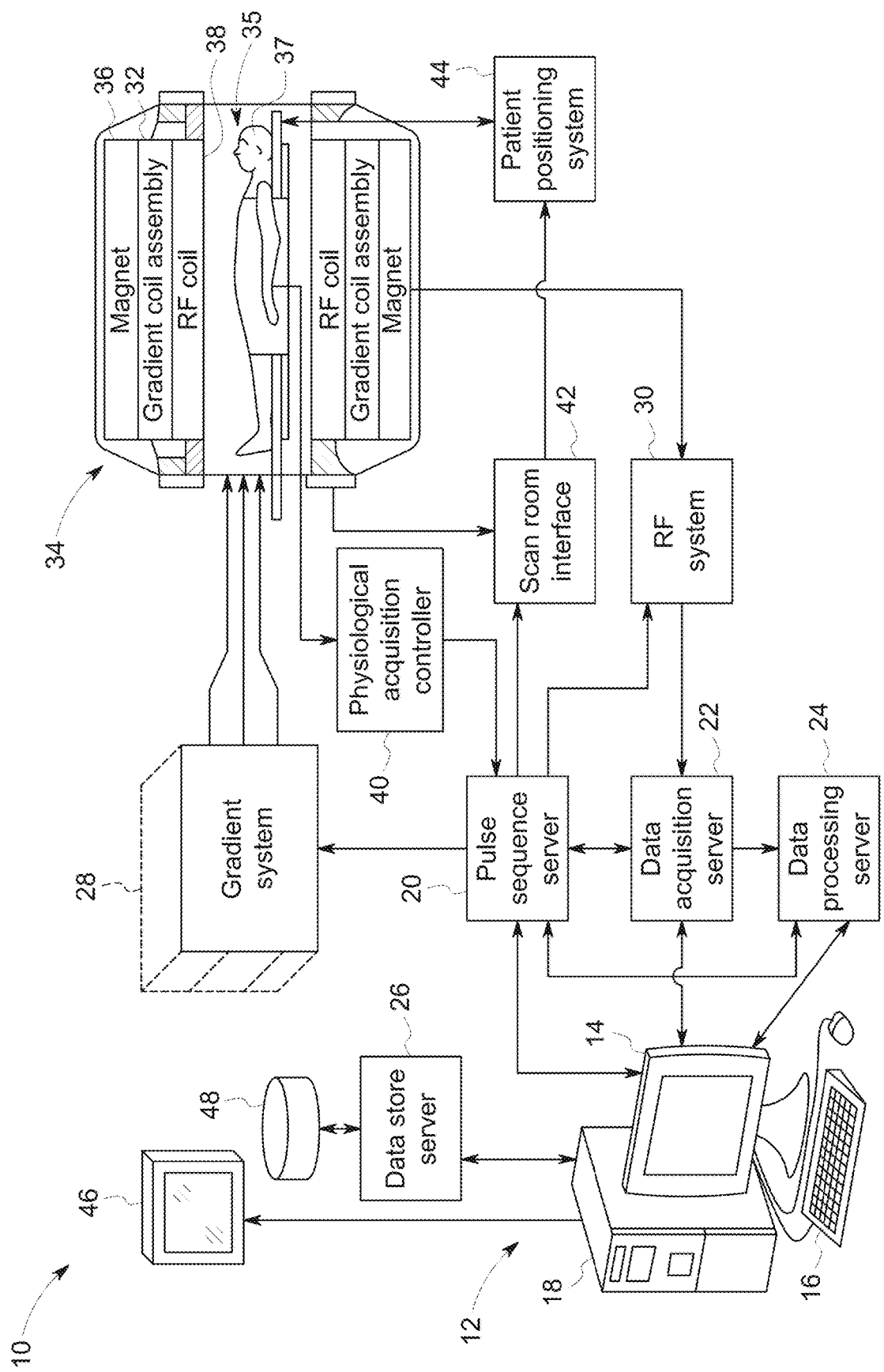
FIG. 1 is a schematic diagram of an exemplary magnetic resonance imaging (MRI) system.

FIG. 1 illustrates a schematic diagram of an exemplary MRI system 10. In the exemplary embodiment, the MRI system 10 includes a workstation 12 having a display 14 and a keyboard 16. The workstation 12 includes a processor 18, such as a commercially available programmable machine running a commercially available operating system. The workstation 12 provides an operator interface that allows scan prescriptions to be entered into the MRI system 10. The workstation 12 is coupled to a pulse sequence server 20, a data acquisition server 22, a data processing server 24, and a data store server 26. The workstation 12 and each server 20, 22, 24, and 26 communicate with each other.

In the exemplary embodiment, the pulse sequence server 20 responds to instructions downloaded from the workstation 12 to operate a gradient system 28 and a radiofrequency ("RF") system 30. The instructions are used to produce gradient and RF waveforms in MR pulse sequences. An RF coil 38 and a gradient coil assembly 32 are used to perform the prescribed MR pulse sequence. The RF coil 38 is shown as a whole body RF coil. The RF coil 38 may also be a local coil that may be placed in proximity to the anatomy to be imaged, or a coil array that includes a plurality of coils.

In the exemplary embodiment, gradient waveforms used to perform the prescribed scan are produced and applied to the gradient system 28, which excites gradient coils in the gradient coil assembly 32 to produce the magnetic field gradients $G_x$, $G_y$, and $G_z$ used for position-encoding MR signals. The gradient coil assembly 32 forms part of a magnet assembly 34 that also includes a polarizing magnet 36 and the RF coil 38. The magnet assembly 34 forms a bore 35, where a subject 37 such as a patient is received and scanned.

In the exemplary embodiment, the RF system 30 includes an RF transmitter for producing RF pulses used in MR pulse sequences. The RF transmitter is responsive to the scan prescription and direction from the pulse sequence server 20 to produce RF pulses of a desired frequency, phase, and pulse amplitude waveform. The generated RF pulses may be applied to the RF coil 38 by the RF system 30. Responsive MR signals detected by the RF coil 38 are received by the RF system 30, amplified, demodulated, filtered, and digitized under direction of commands produced by the pulse sequence server 20. The RF coil 38 is described as a transmitter and receiver coil such that the RF coil 38 transmits RF pulses and detects MR signals. In one embodiment, the MRI system 10 may include a transmitter RF coil that transmits RF pulses and a separate receiver coil that detects MR signals. A transmission channel of the RF system 30 may be connected to a RF transmission coil and a receiver channel may be connected to a separate RF receiver coil. Often, the transmission channel is connected to the whole body RF coil 38 and each receiver section is connected to a separate local RF coil.

In the exemplary embodiment, the RF system 30 also includes one or more RF receiver channels. Each RF receiver channel includes an RF amplifier that amplifies the MR signal received by the RF coil 38 to which the channel is connected, and a detector that detects and digitizes the I and Q quadrature components of the received MR signal. The magnitude of the received MR signal may then be determined as the square root of the sum of the squares of the I and Q components as in Eq. (1) below:

$$M = \sqrt{I^2 + Q^2} \quad (1);$$

and the phase of the received MR signal may also be determined as in Eq. (2) below:

$$\varphi = \tan^{-1}\left(\frac{Q}{I}\right). \quad (2)$$

In the exemplary embodiment, the digitized MR signal samples produced by the RF system 30 are received by the data acquisition server 22. The data acquisition server 22 may operate in response to instructions downloaded from the workstation 12 to receive real-time MR data and provide buffer storage such that no data is lost by data overrun. In some scans, the data acquisition server 22 does little more than pass the acquired MR data to the data processing server 24. In scans that need information derived from acquired MR data to control further performance of the scan, however, the data acquisition server 22 is programmed to produce the needed information and convey it to the pulse sequence server 20. For example, during prescans, MR data is acquired and used to calibrate the pulse sequence performed by the pulse sequence server 20. Also, navigator signals may be acquired during a scan and used to adjust the operating parameters of the RF system 30 or the gradient system 28, or to control the view order in which k space is sampled.

In the exemplary embodiment, the data processing server 24 receives MR data from the data acquisition server 22 and processes it in accordance with instructions downloaded from the workstation 12. Such processing may include, for example, Fourier transformation of raw k-space MR data to produce two or three-dimensional images, the application of filters to a reconstructed image, the performance of a back-projection image reconstruction of acquired MR data, the generation of functional MR images, and the calculation of motion or flow images.

In the exemplary embodiment, images reconstructed by the data processing server 24 are conveyed back to, and stored at, the workstation 12. In some embodiments, real-time images are stored in a database memory cache (not shown in FIG. 1), from which they may be output to operator display 14 or a display 46 that is located near the magnet assembly 34 for use by attending physicians. Batch mode images or selected real time images may be stored in a host database on disc storage 48 or on a cloud. When such images have been reconstructed and transferred to storage, the data processing server 24 notifies the data store server 26. The workstation 12 may be used by an operator to archive the images, produce films, or send the images via a network to other facilities.

Functional MRI (fMRI) has been used to study and diagnose brain functions based on the observations that when neural activities increase in a particular area of the brain, MR signals increase by a small amount in that particular area because of an effect called the blood oxygenation level dependent (BOLD) effect. In an fMRI image acquisition, the subject alternates between periods of doing a task and a control state, for example, 30-second blocks of looking at visual stimulus alternating with 30-second blocks with eyes closed. The acquired fMRI data is analyzed to identify brain areas in which the MR signals have a matching pattern of changes, and these identified areas are areas in the brain activated by the stimulus, in this example, the visual cortex at the back of the subject's head. The activated areas are highlighted on the subject's MR images.

Because fMRI studies temporal changes of MR images, MR images are acquired to quickly to achieve a desired temporal resolution. In the meantime, the images should have a certain level of resolution that enables the activated areas in the brain to be identified. Although repetitions of image acquisitions increase signal-to-noise ratio (SNR) of images, the scan time for acquiring MR images has a limit due to the subject's comfort. As a result, fMRI often faces the challenge of achieving adequate image resolution as well as temporal resolution within a reasonable scan time. A typical pulse sequence used for fMRI studies is the echo planar imaging (EPI) sequence. In EPI, after a slice is selected and excited, phase-encoding gradients are quickly switched to scan through the k-space for the slice along a Cartesian grid. After the excitation, the magnetic moment in the x-y plane tends to dephase due to field inhomogeneity and as a result, the MR signals decay. Because the EPI sequence acquires an entire k-space plane after one excitation, the MR signals acquired by an EPI sequence have a relatively low SNR. To compromise, EPI images are acquired with a relatively low image resolution, such as 64×64 (number of voxels in the x and y directions). Therefore, anatomical images of higher image resolution, such as 256×256, are acquired separately with a different pulse sequence, usually before the acquisition of functional images. The brain areas for the specific neural activities identified by functional images acquired with an EPI sequence are then overlaid on anatomical images.

Also because an EPI sequence acquires the entire k-space plane after one RF excitation, EPI images suffer from chemical shift and geometric distortion more than anatomical images. In addition, because of the fast switching of gradients, the EPI sequence produces a loud, high-pitched noise in the bore of the magnet, where the subject is received. The noise is a disturbance to the subject, especially for patients sensitive to loud acoustic noise such as patients suffering from tinnitus and posttraumatic stress disorder (PTSD). The loud noise also limits functional studies of auditory neural functions and resting state networks in the brain.

Functional MRI is used an example herein. The methods and systems disclosed herein may be used for any dynamic imaging, such as imaging contrast uptake in the body.

Figure 2A:
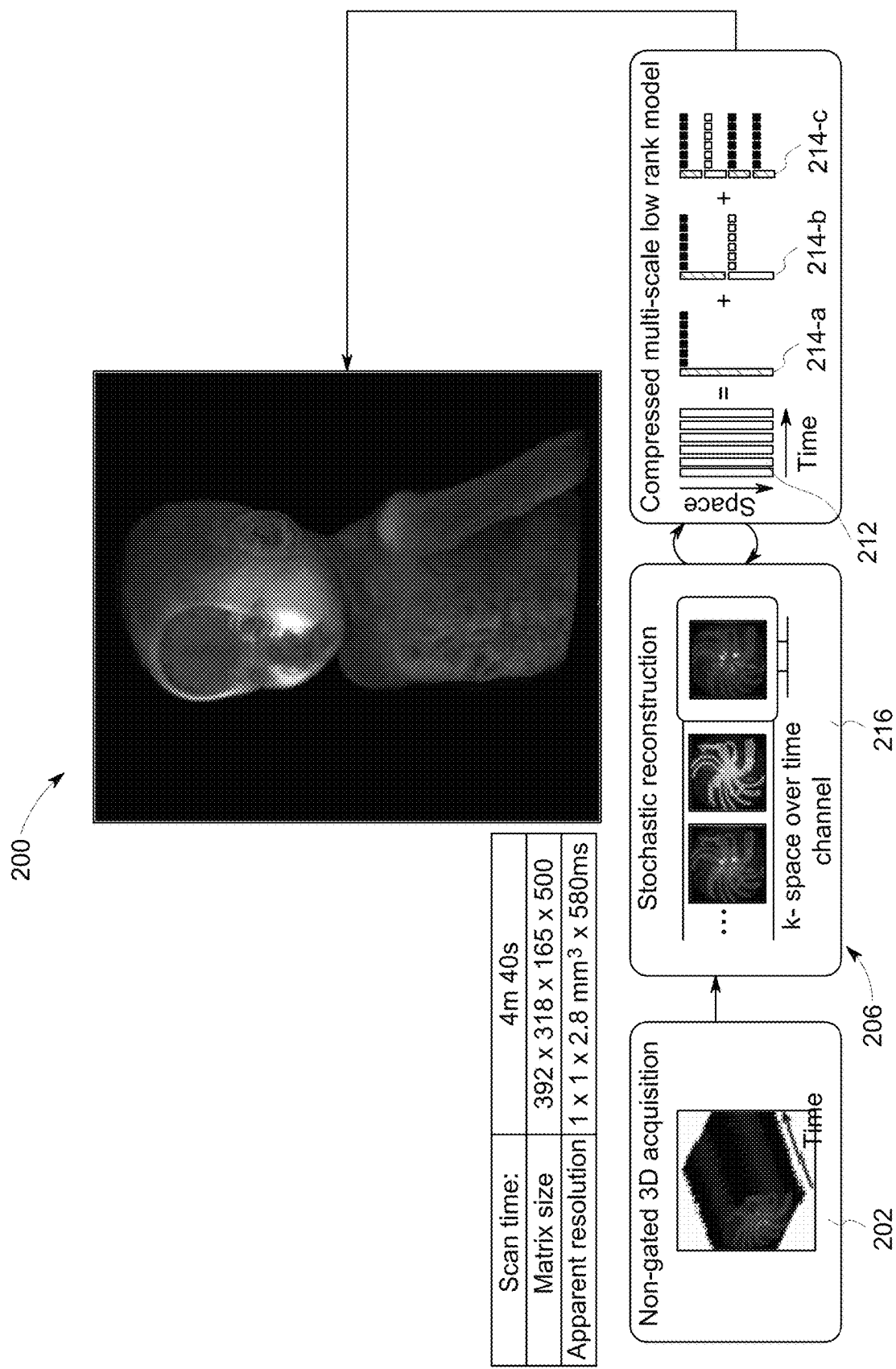
FIG. 2A is a schematic diagram of an exemplary method of dynamic MR imaging.
Figure 2B:
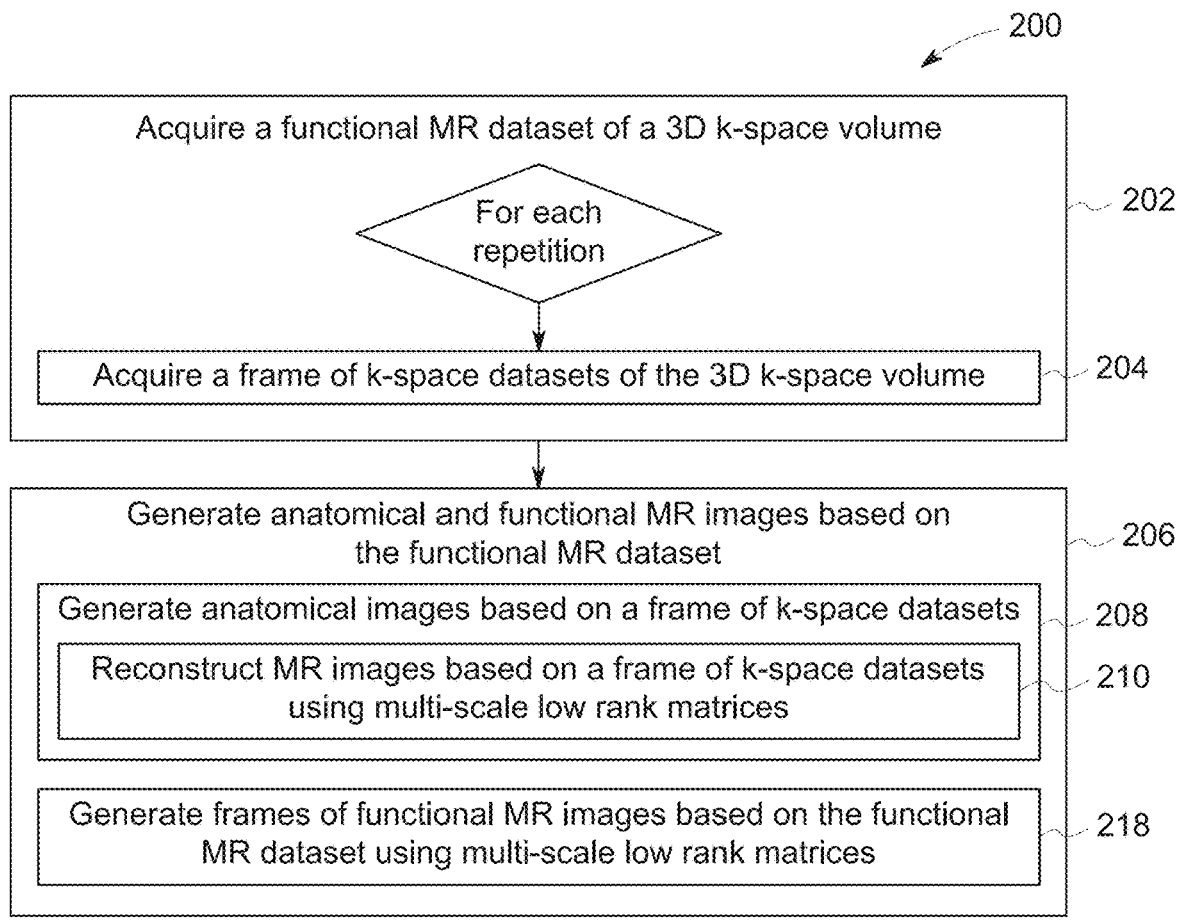
FIG. 2B is a flow chart of the method shown in FIG. 2A.

The systems and methods disclosed herein provide a silent method of acquiring functional MR datasets without the need for a separate anatomical image acquisition. A silent method used herein means that acquiring functional datasets has a sound level that is much less than that of an acquisition using an EPI sequence, and may be similar to that of the background noise of the MRI system before imaging. Functional and anatomical images are generated based on the same functional MR dataset. This approach is advantageous because it reduces scan time and avoids the need to register an anatomical image to the functional images and registration errors. FIGS. 2A and 2B show an exemplary method 200 of a dynamic MR imaging. FIG. 2A is a schematic diagram of the method 200. FIG. 2B is a flow chart of the method 200.

In the exemplary embodiment, the method 200 includes acquiring 202 a functional MR dataset of a 3D k-space volume of the subject. In acquiring 202 a functional MR dataset, a frame of k-space datasets of the 3D k-space volume is repeatedly acquired 204 for a number of repetitions, while functional stimuli are applied to the subject, e.g., showing a visual pattern with 30 seconds on and 30 seconds off. A functional MR dataset includes the plurality frames of k-space datasets. Anatomical and functional images are generated 206 based on the functional MR dataset. Generating 206 anatomical and functional images includes generating 208 anatomical images based on the functional MR dataset. The functional MR dataset has a large data volume. For example, if the matrix size is 392×318×165, where the number of voxels in the x, y, and z directions are 392, 318, and 165, respectively, and if the number of frames is 500, the associated volume of data is approximately 125 gigabytes (GB). Because of the large volume of data, the MR images may be reconstructed 218 by expanding the functional MR dataset as a sum of the multi-scale low rank (MSLR) matrices, to increase the speed of the computation and the volume of available memory storage space. MSLR matrices are low-rank matrices of various scales of block sizes. For example, the functional MR dataset is a spatial-temporal matrix 212 and can be expressed as a sum of block-wise low-rank matrices 214-a, 214-b, 214-c, where 214-a, 214-b, 214-c have decreasing scales of block sizes (FIG. 2A). To further reduce the computation load, improve memory locality, and minimize communications between threads and processors, a stochastic optimization 216 may be used.

In the exemplary embodiment, anatomical images are generated 208 based on the same functional MR dataset. A frame of k-space datasets may be used to generate anatomical images. The anatomical images may be reconstructed 210 by expanding the frame of k-space datasets as a sum of MSLR matrices.

Generating 206 anatomical and functional MR images includes generating 218 functional images based on the functional MR dataset. In one embodiment, a frame of functional images may be reconstructed with a subset of the functional MR dataset that are acquired adjacent the time point for the frame to reduce the amount of data. In another embodiment, because temporal changes across the functional images are of interest, functional images may be reconstructed by reconstructing a difference image, which is an image representing the difference between a frame and the previous frame. In some embodiments, the functional images are reconstructed by expanding the functional MR dataset with a smaller set of MSLR matrices than the set of MSLR matrices for anatomical images, where the smaller set of MSLR matrices reflects temporal changes.

In some embodiments, the temporal resolution of the functional MR images is greater than the sampling rate determined by the time imaging a 3D volume. Functional images of a 3D volume are generated by repeated imaging the 3D volume with the interval between the repetitions as the imaging time for the 3D volume. The temporal resolution of the functional images for a known method is limited by the temporal sampling rate of the imaging time for the 3D volume. In contrast, the functional images in the systems and methods herein may be generated using a subset of MR signals for the entire 3D volume for each repetition, and therefore, the temporal resolution of the functional images may be expanded greater than the sampling rate of the imaging time for the 3D volume. For example, in EPI fMRI or other known fMRI, the lengths of the time segments of each frame are fixed and defined at the point of acquisition, e.g. a dataset acquired with a time of repetition (TR) for a 3D volume of 2.1 s can only be reconstructed at a TR of 2.1 s. Whereas with the systems and methods described herein, functional images may be flexibly reconstructed with different time segments after acquisition. e.g. for a 3D volume shown in FIG. 5C acquired with a TR of 580 ms, using the same dataset, functional images may be reconstructed to have a different TR, such as 200 ms or 300 ms.

In some embodiments, after the functional images are generated, areas of brain indicating neural functions are identified using fMRI data processing methods, such as identifying voxels of interest using cross-correlation between times series of a voxel and the stimuli pattern. The identified voxels are highlighted in anatomical images to show neural activities in the brain (see FIGS. 5B, 5D, 5F, 6B, 6D, and 6F).

Figure 3A:
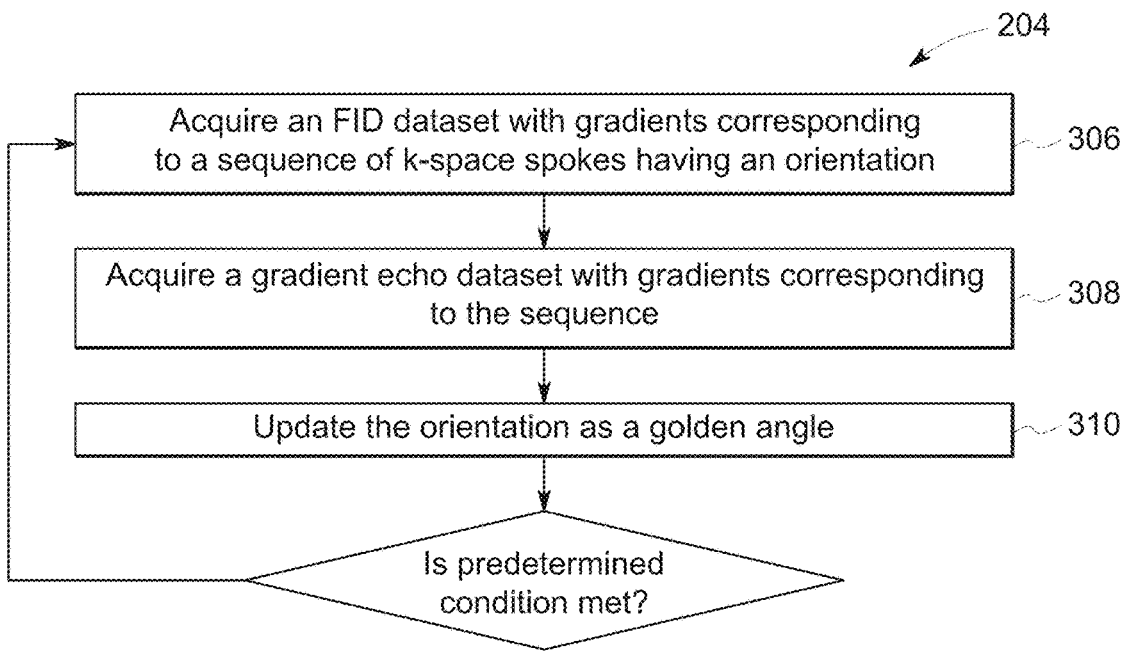
FIG. 3A is a flow chart of an exemplary method of acquiring k-space datasets.
Figure 3B:
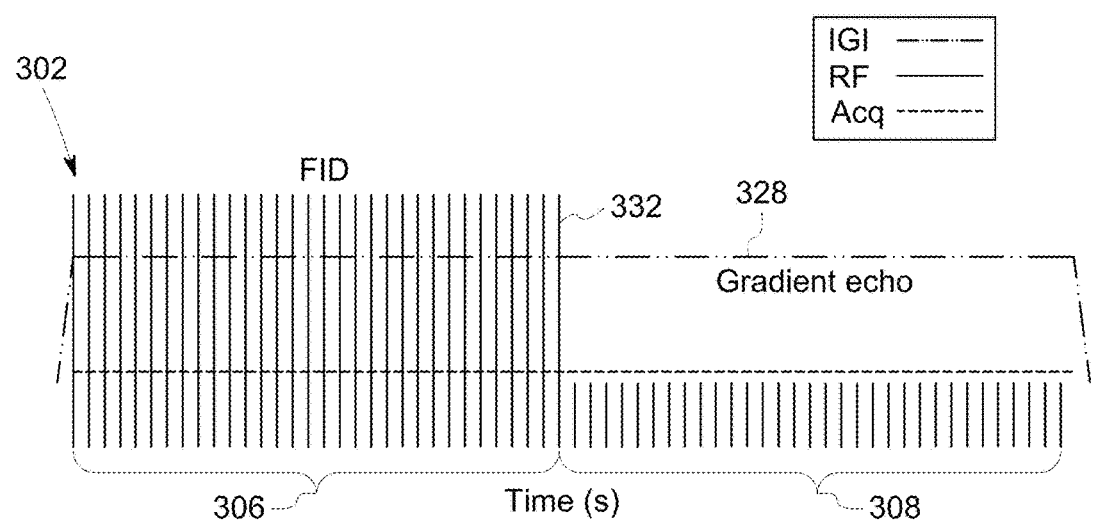
FIG. 3B is an exemplary pulse sequence used in the method shown in FIG. 3A.
Figure 3C:
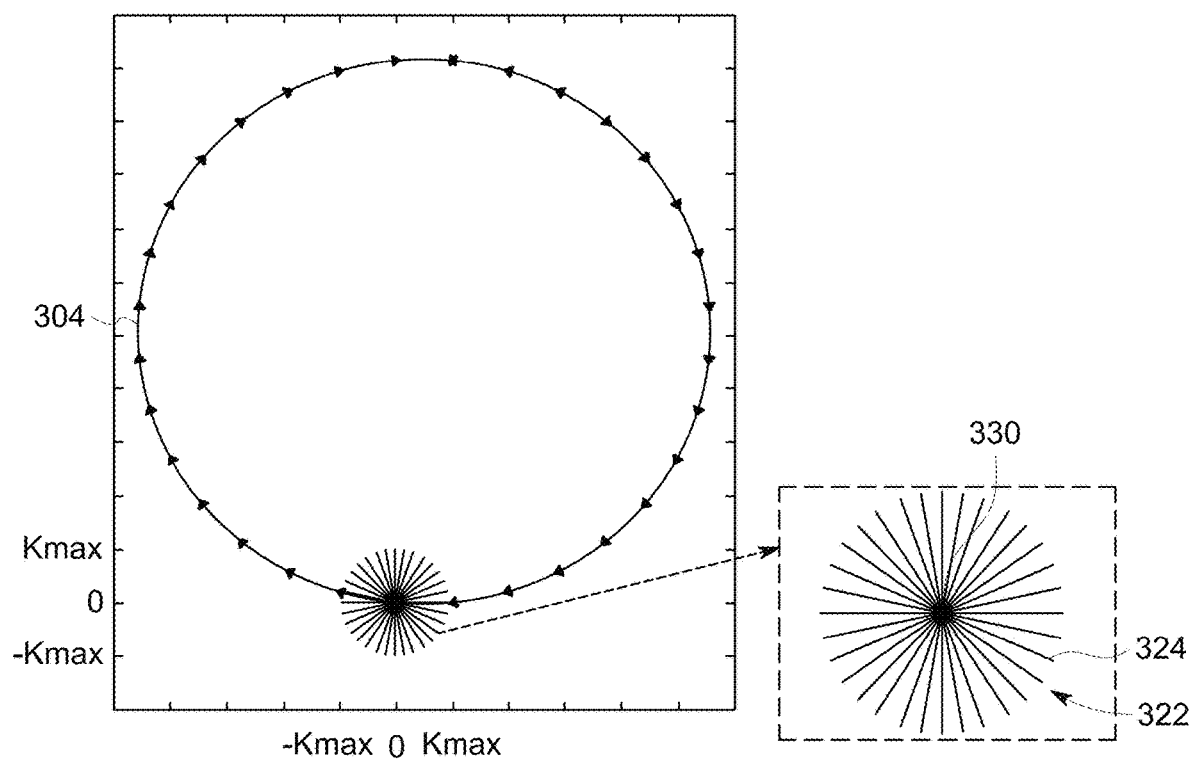
FIG. 3C is a cumulative k-space trajectory when the pulse sequence shown in FIG. 3B is applied.
Figure 3D:
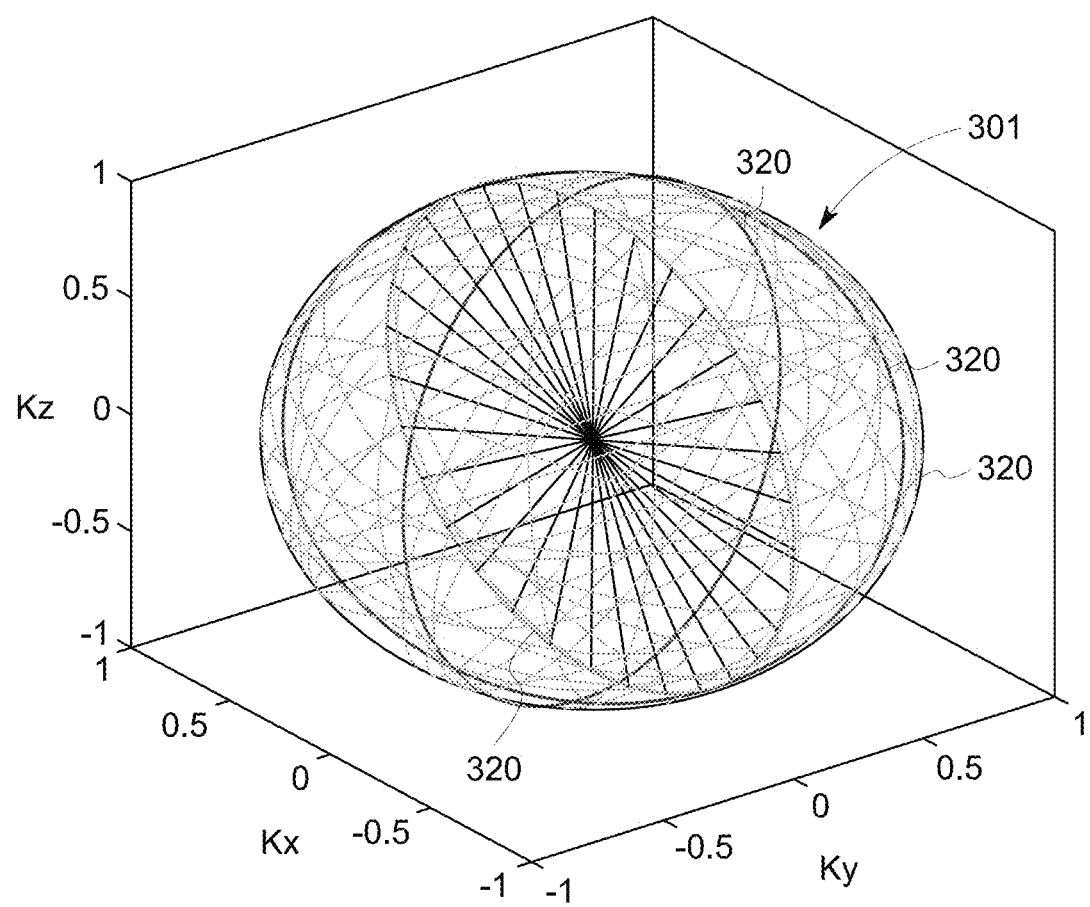
FIG. 3D is a k-space volume acquired with the method shown in FIG. 3A.

FIGS. 3A-3D show an exemplary method 204 of acquiring k-space datasets of a 3D k-space volume 301 (FIG. 3D). FIG. 3A is a flow chart of the method 204. FIG. 3B is a plot of an exemplary pulse sequence 302 used in the method 204. FIG. 3C shows a cumulative trajectory 304 in k-space when the pulse sequence 302 is applied. FIG. 3D is a 3D plot of the 3D k-space volume 301 acquired with the pulse sequence 302.

Figure 3E:
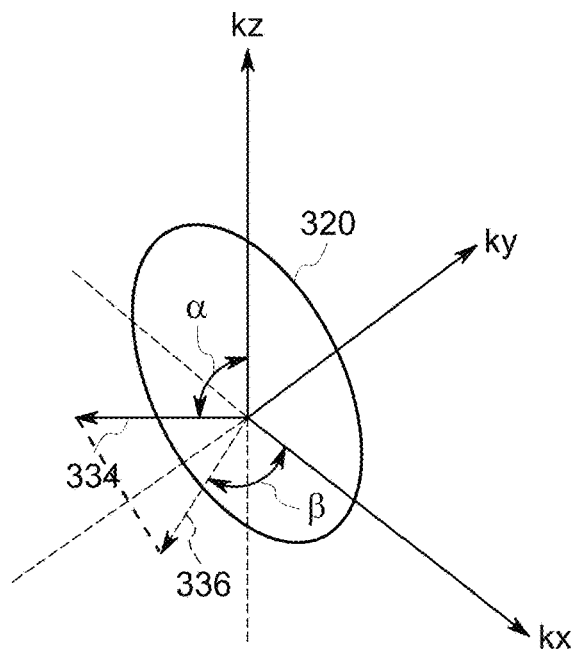
FIG. 3E is a diagram illustrating an exemplary definition of an orientation of a k-space segment.

In the exemplary embodiment, the method 204 includes acquiring 306 a free induction decay (FID) dataset with gradients corresponding to a sequence of k-space spokes or k-space lines having an orientation in the 3D k-space. The sequence 322 of k-space spokes 324 samples a segment 320 of the k-space. FIG. 3E illustrates an exemplary definition of the orientation of the segment 320. An orientation used herein is the angle of the segment 320 in the 3D k-space. The orientation of the segment 320 is defined by a polar angle α and an azimuthal angle β. The polar angle α is the angle between the kz axis and a normal vector 334 of the segment 320. The azimuthal angle β is the angle between the kx axis and a projection 336 of the normal vector 334 onto the kx-ky plane. The FID dataset includes FID MR signals, which are MR signals acquired immediately after an application of an excitation RF pulse. Acquiring immediately used herein means the time between the end of the RF pulse and the beginning of the acquisition is negligible. The method 204 further includes acquiring 308 a gradient echo dataset corresponding to the sequence 322 of spokes 324. The method 204 includes updating 310 the orientation as golden angles. The method 204 also includes repeating acquiring 306 a FID dataset, acquiring 308 a gradient echo dataset, and updating 310 until a predetermined condition is met. The predetermined condition may be that the number of repetitions is equal to the number of a preset matrix size in the z direction. As such, k-space datasets of a 3D k-space volume 301 are acquired 204 by the iterative application of a pulse sequence 302 that scans a segment 320 of the k-space covered by a sequence 322 of spokes 324, the orientation of the segment 320 being at golden angles in the 3D k-space (FIGS. 3B-3D).

In the exemplary embodiment, the pulse sequence 302 shown in FIG. 3B corresponds to pulses for a sequence 322 of spokes 324 in the k-space to sample one segment 320 of the k-space (FIGS. 3B-3D). In the pulse sequence 302, gradients 328 are applied during the acquisition 306 of an FID dataset and acquisition 308 of a gradient echo dataset. The same sequence 322 of spokes 324 are acquired during the acquisition 306 of an FID dataset and acquisition 308 of a gradient echo dataset. That is, the same sequence of gradients 328 are applied, and the same segment 320 of k-space is scanned with a plurality of time of echo (TE), one at TE=0 for the FID dataset and one at TE=echo time of the gradient echo. The pulse sequence 302 shows one gradient echo dataset is acquired. Multiple gradient echo datasets may be acquired at multiple TEs. The TE may be adjusted to maximize tissue contrast based on the transverse relaxation time $T_2^*$. Multi-gradient echo datasets also allow objective separation of BOLD effects from non-BOLD effects, removal of motion effects from an fMRI time course, and measurement of BOLD signal deep in the ventromedial prefrontal cortex.

In acquiring an FID dataset, the gradients G 328 are applied to sample the k-space. k is a spatial frequency, i.e., an inverse of a distance. k is related to a gradient as:

$$k_r(t) = \gamma \int_0^t G(r,t) dt, \qquad (3)$$

where γ is a gyromagnetic ratio, and r is a direction of the gradient G, such as x, y, z, or other directions in a 3D space. In sampling along a k-space spoke, with a constant gradient 328 applied along a direction r, k may start from the k-space center 330, increasing along the k-space spoke 324 until reaching a periphery of the k-space. When a segment 320 of the k-space is sampled, a plurality of spokes 324 in the segment 320 are sampled. The spokes 324 in one segment 320 rotate within the segment 320 at a constant angular increment from their neighboring spokes 324, where the angular increment is 360 degrees divided by a number of spokes per loop or per segment. Between spokes 324 in the same segment 320, the directions r of the gradients 328 are slightly changed, but the magnitude of the gradients 328 may remain constant. Because of this slight change of gradients, instead of fast switching of gradients, quiet operation of the MRI system 10 is enabled. The acoustic noise produced during application of the pulse sequence 302 may be similar to the background noise before imaging is performed. The acoustic noise may be further reduced by applying gradients such that k-space is scanned curved k-space spokes.

In the depicted example, during acquisition of an FID dataset, an RF pulse 332 may be applied after a gradient 328 corresponding to a spoke 324 is applied, and immediately after the application of the RF pulse 332, the FID dataset sampled by the spoke 324 is acquired. Then a gradient 328 corresponding to another spoke 324 in the segment 320 is applied, the RF pulse 332 is applied, and the FID dataset for that spoke 324 is acquired.

After a predetermined number of spokes in a segment have been scanned, a gradient echo dataset is acquired 308. During acquisition 308 of gradient echo dataset, RF pulse 332 is not applied, but the same sequence 322 of spokes 324 are sampled by varying the gradients in the same manner as during the acquisition of the FID dataset.

In the exemplary embodiment, to sample multiple segments 320 of the k-space, the pulse sequence 302 is repeated, except for applying a different set of gradients that correspond to another segment 320 of the k-space having a different orientation in the 3D k-space. The orientations of the segments 320 are at golden angles with the kx-ky plane. Along the golden angles, segments 320 partition the k-space volume 301, such as a sphere, by a golden mean.

In one dimension, a one-dimensional (1D) golden mean, or a golden section, partitions a line segment into a longer segment of length x and a shorter segment of a unit length such that:

$$\frac{1}{x} = \frac{x}{x+1}. \quad (4)$$

The larger root of Eq. (4) of 1.618 is called a golden ratio, and the smaller root of 0.618 is called a conjugate golden ratio. Each subsegment of the line segment may be further segmented in the same manner into a larger segment and a smaller segment having the same ratio as expressed in Eq. (4), generating a series of partition points of the line segment. The partition points appear pseudo-random on the line segment. Compared to a set of random points on the line segment which exhibit clusters, the golden point set is spatially and temporally uniformly distributed. That is, the partition points generated as golden means sample a line segment uniformly. Golden means may be generated by other mechanisms, such as by using a Fibonacci sequence, or deriving eigenvalues of matrices after successive Fibonacci transformations.

Figure 3F:
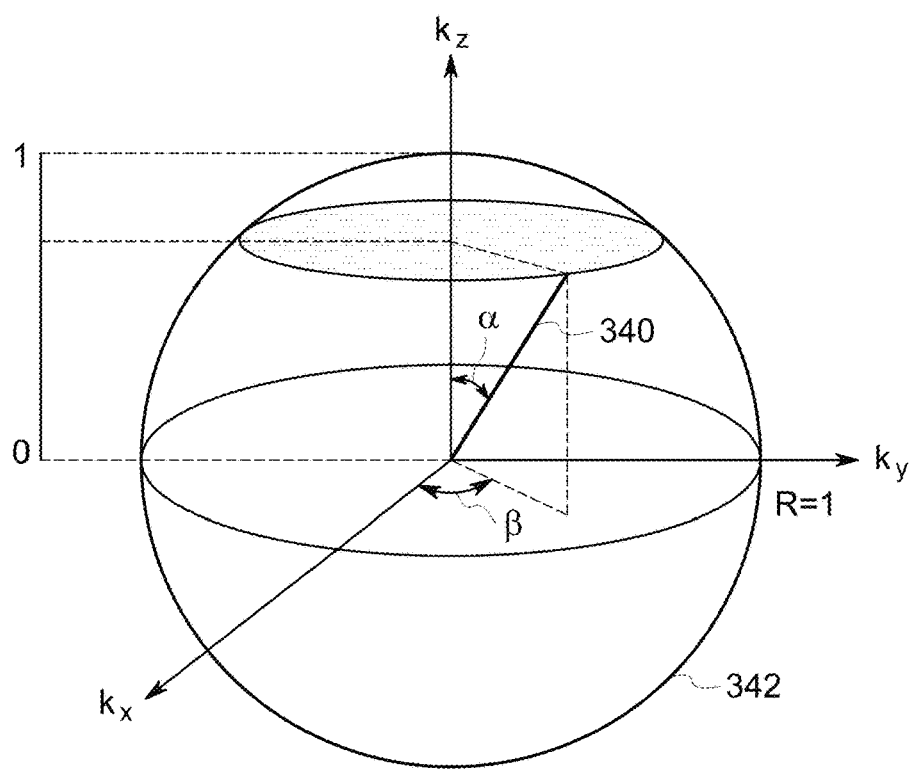
FIG. 3F shows an exemplary orientation having golden angles in a 3D k-space.

In the exemplary embodiment, the orientations of the segments 320 are golden angles derived as gold means for sampling a k-space volume 301. As a result, the plurality of segments 320 partition the k-space volume pseudo-randomly and uniformly. In one example, in the pairs of golden angles ($\alpha$, $\beta$) for the orientations of the segments 320, the polar angles $\alpha$ are corresponding polar angles of unit vectors 340, vectors having magnitudes of one, on a unit sphere 342 having a radius of one, where projections of the unit vectors 340 onto the kz axis partition a unit length in the kz axis by golden means (FIG. 3F). The azimuthal angles $\beta$ are corresponding azimuthal angles of the unit vectors 340, where projections of the unit vectors 340 onto the kx-ky plane partition a unit length in the kx-ky plane by golden means. Because a segment 320 spans from $-k_z$ to $k_z$, the polar angles $\alpha$ for half of the k-space volume 301 are needed. Further, negative azimuthal angles $\beta$ may be generated as corresponding azimuthal angles of the unit vectors 340, where projections of the unit vectors 340 onto the kx-ky plane partition a negative unit length in the kx-ky plane by golden means. The golden angles ($\alpha$, $\beta$) may be derived in other ways that enable the systems and methods function as described herein.

In the exemplary embodiment, the segments 320 are generated based on pairs of golden angles. A "mother" segment is generated as a set of spokes 324 on the ky-kx plane. A new segment 320 is generated by rotating the mother segment with a rotation matrix. The rotation matrix performs a rotation of the segment 320 about the kx axis first at the angle of the azimuthal angle $\beta$, and then a rotation about the kz axis at the polar angle $\alpha$. Alternatively, the mother segment is in the kx-kz plane and new segments 320 are generated by rotating the mother segment about the kz axis at the polar angle $\alpha$ and then about the kx axis at the azimuthal angle $\beta$. Accordingly, the segments 320 are generated by rotating the mother segment into segments having an orientation of golden angles ($\alpha$, $\beta$).

Figure 4A:
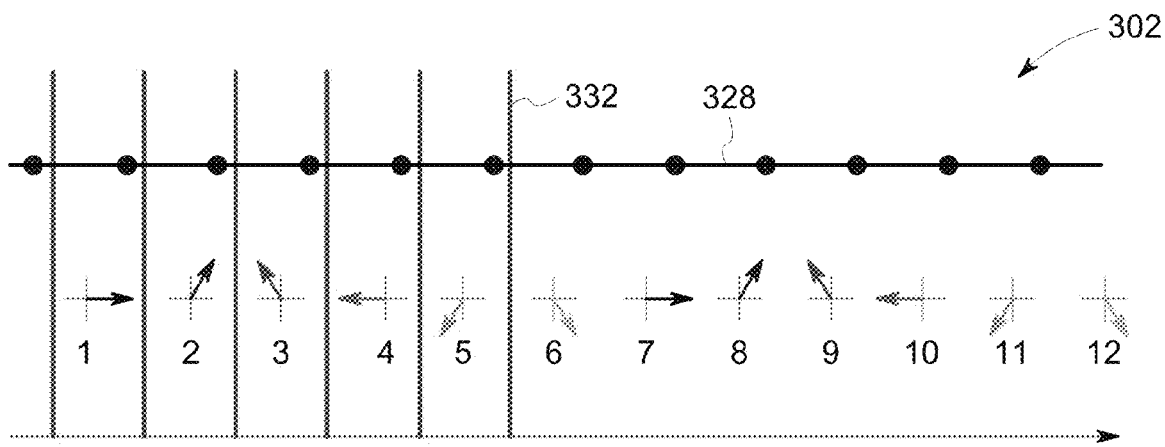
FIG. 4A shows an exemplary pulse sequence.
Figure 4B:
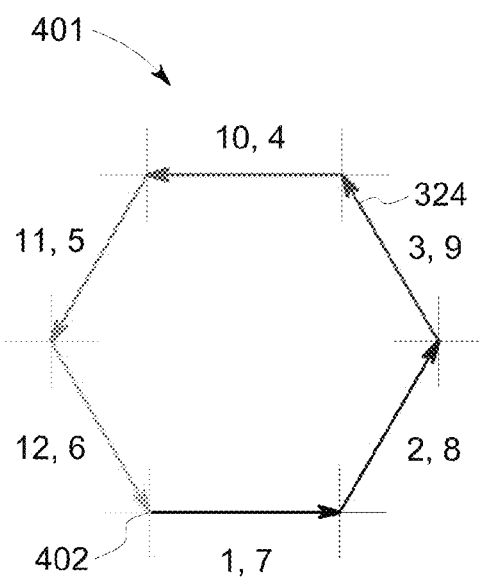
FIG. 4B shows echoes formed when the pulse sequence shown in FIG. 4A is applied.

Images acquired with the pulse sequence 302 may have artifacts caused by a phenomenon called echo-in echo-out. FIG. 4A shows the pulse sequence 302 with 6 spokes 324 sampled in a segment 320. FIG. 4B shows echoes or coherences formed when the pulse sequence 302 is applied. In the depicted pulse sequence 302, spokes 1-6 are sampled during acquisition of an FID dataset, and spokes 7-12 are sampled during acquisition of a gradient echo dataset. For the purpose of illustration, although spokes 1-6 and spokes 7-12 are the same, different numbers are used. The pulse sequence 302 is a self-refocusing pulse sequence. That is, when one segment 320 of spokes 324 is sampled, the cumulative k-space trajectory 304 forms a loop 401, where the end of the last spoke, for example spoke 6, goes back to the beginning of the first spoke, for example spoke 1 (FIG. 4B). As gradients are varied from spoke 1 to spoke 12, at time points 402 where directions of gradients 328 are changed, an echo corresponding to the present spoke starts to form while an echo corresponding to the spoke of the end of the loop 401 is about to end. As such, the acquired data includes MR signals from different spokes, i.e., different locations in k-space, and this mix-up causes artifacts in the reconstructed images.

Figure 4C:
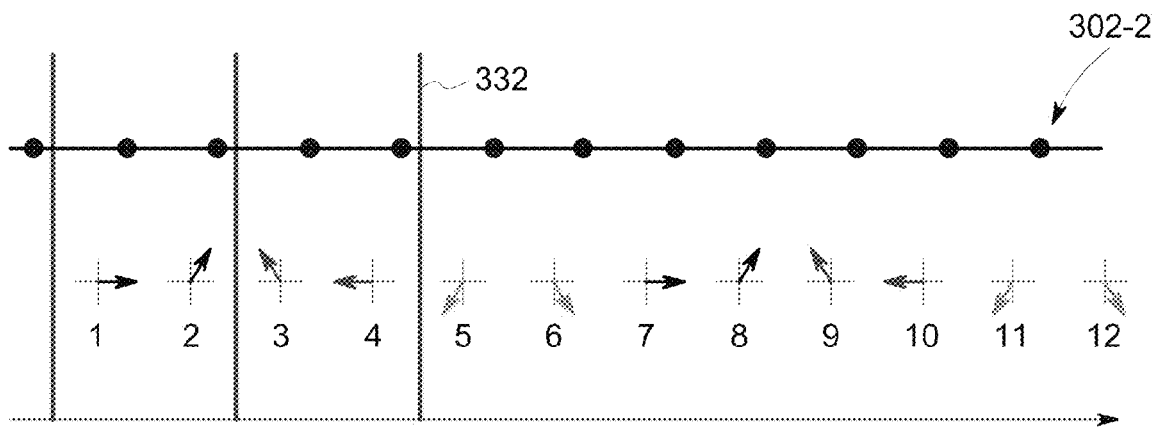
FIG. 4C shows another exemplary pulse sequence.
Figure 4D:
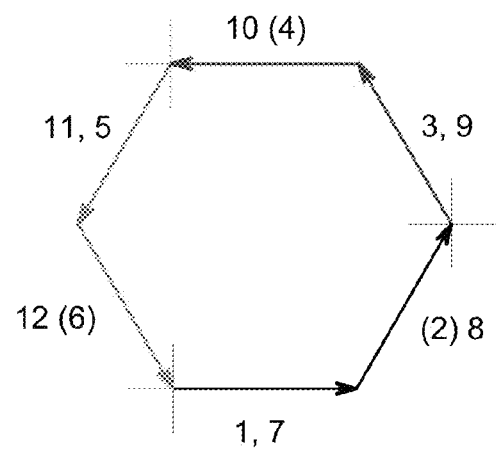
FIG. 4D shows echoes formed when the pulse sequence shown in FIG. 4C is applied.

FIG. 4C shows an exemplary pulse sequence 302-2 for reducing the echo-in echo-out artifacts. FIG. 4D shows the echoes formed when the pulse sequence 302-2 is applied. In the pulse sequence 302-2, gradients 328 are applied and varied in the same manner as in the pulse sequence 302, but the RF pulse 332 is applied every two spokes 324, instead of every spoke 324 for pulse sequence 302. As a result, the echo-in echo-out artifacts are reduced.

Figure 4E:
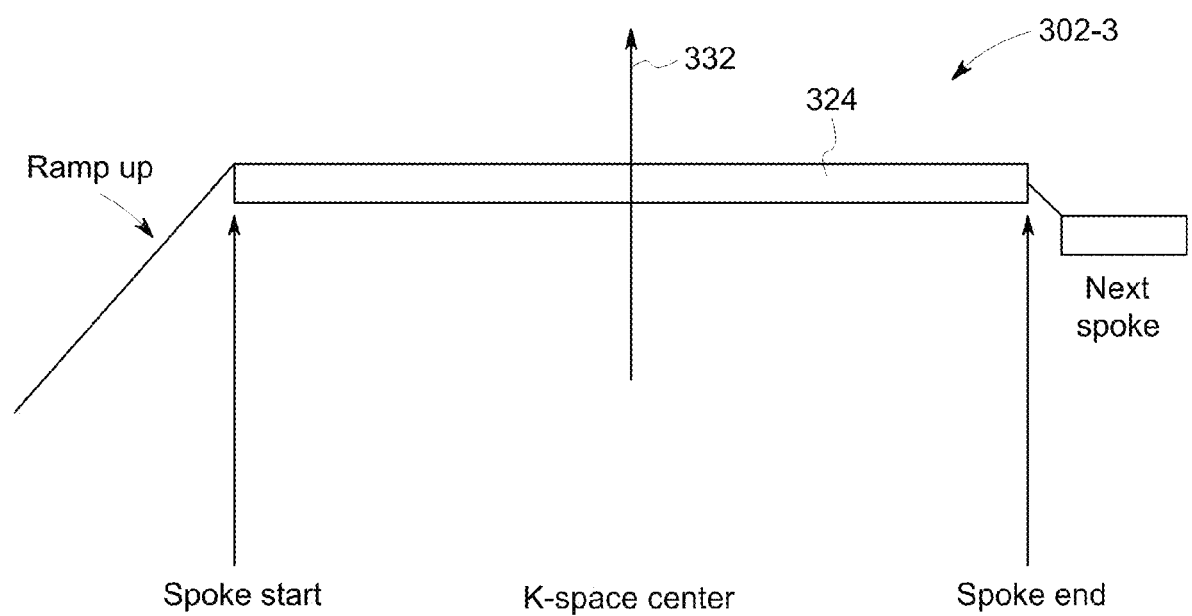
FIG. 4E shows one more exemplary pulse sequence.

FIG. 4E shows another pulse sequence 302-3 for reducing the echo-in echo-out artifacts. In FIG. 4E, only the relative timing between the RF pulse 332 and the spoke 324 is shown. Instead of starting a spoke 324 at the center of the k-space, the spoke 324 is a full-diameter spoke, where the spoke 324 starts from a periphery of the k-space, passing through the center of the k-space, and extends to the opposite periphery of the k-space. The RF pulse 332 is applied when the spoke 324 reaches the center of the k-space. As a result, the echo acquired corresponds to a specific spoke, instead of being mixed with an echo corresponding to a different spoke. Accordingly, echo-in echo-out artifacts are reduced.

Figure 4F:
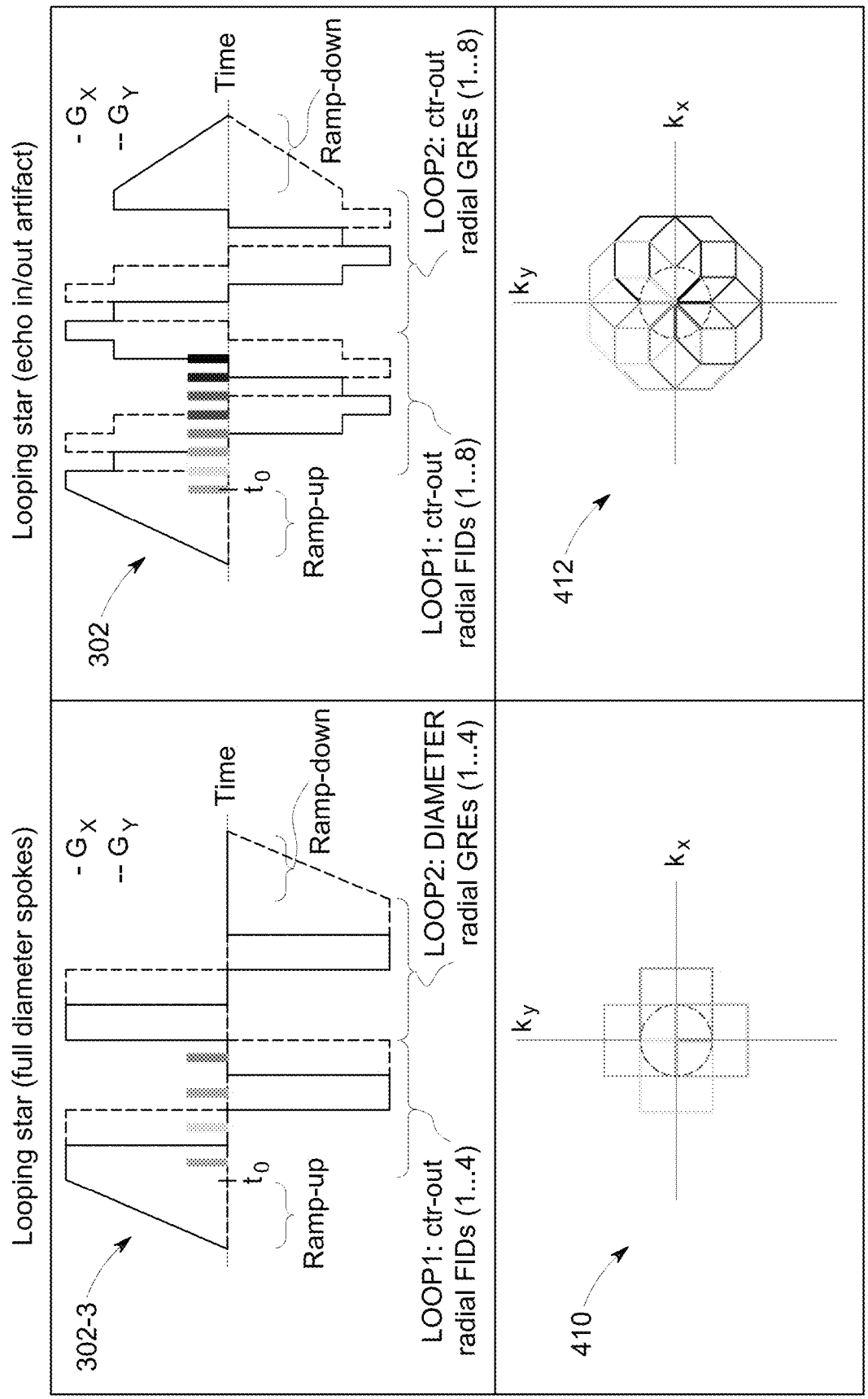
FIG. 4F shows a comparison of k-space trajectories for the pulse sequence shown in FIG. 4E with the pulse sequence shown in FIG. 4A.
Figure 6D:
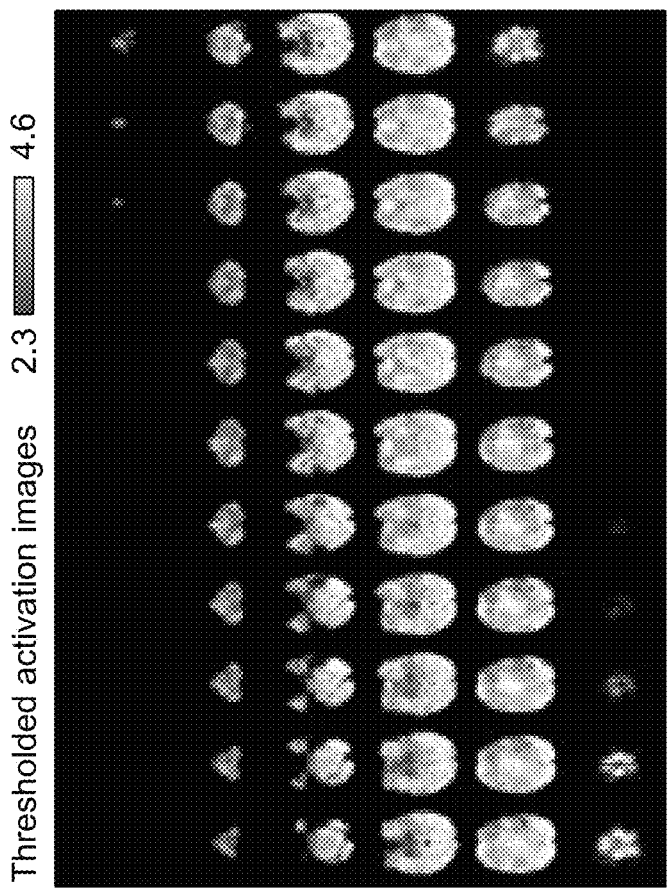
FIG. 6D is an enlarge view of the plot shown in FIG. 5D.
Figure 6C:
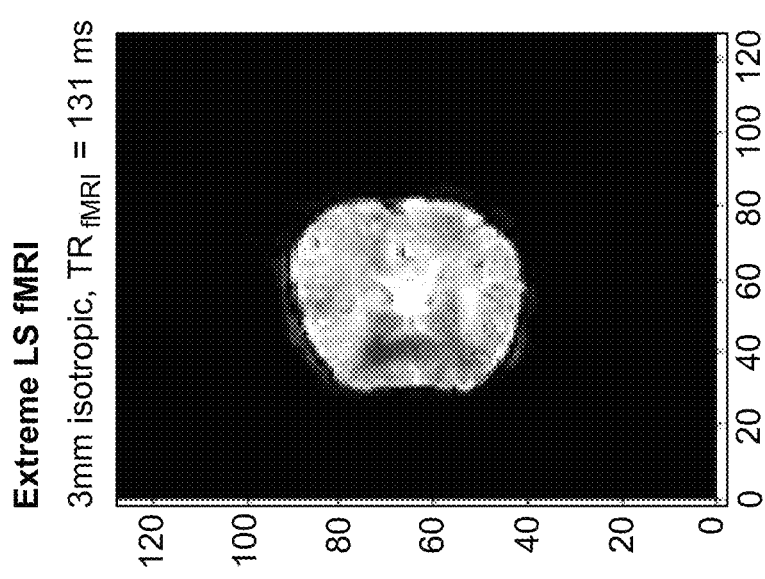
FIG. 6C is an enlarge view of the image shown in FIG. 5C.
Figure 6F:
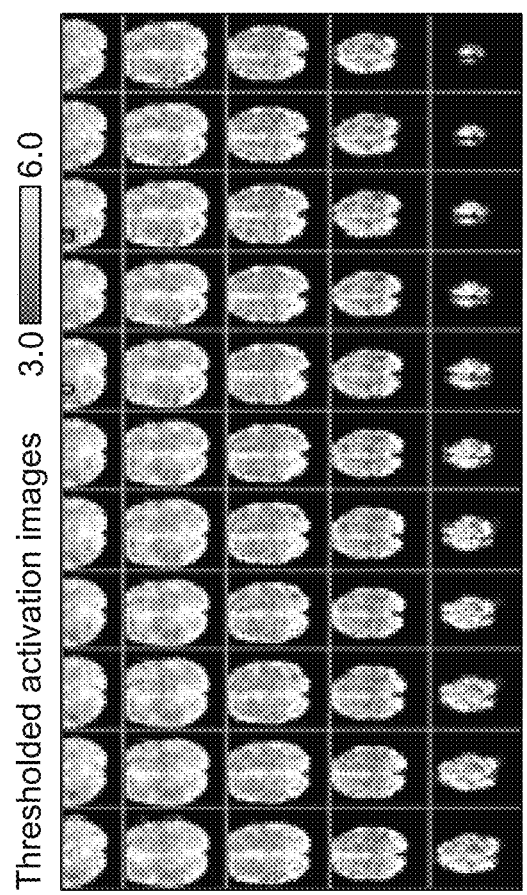
FIG. 6F is an enlarge view of the plot shown in FIG. 5F.
Figure 6E:
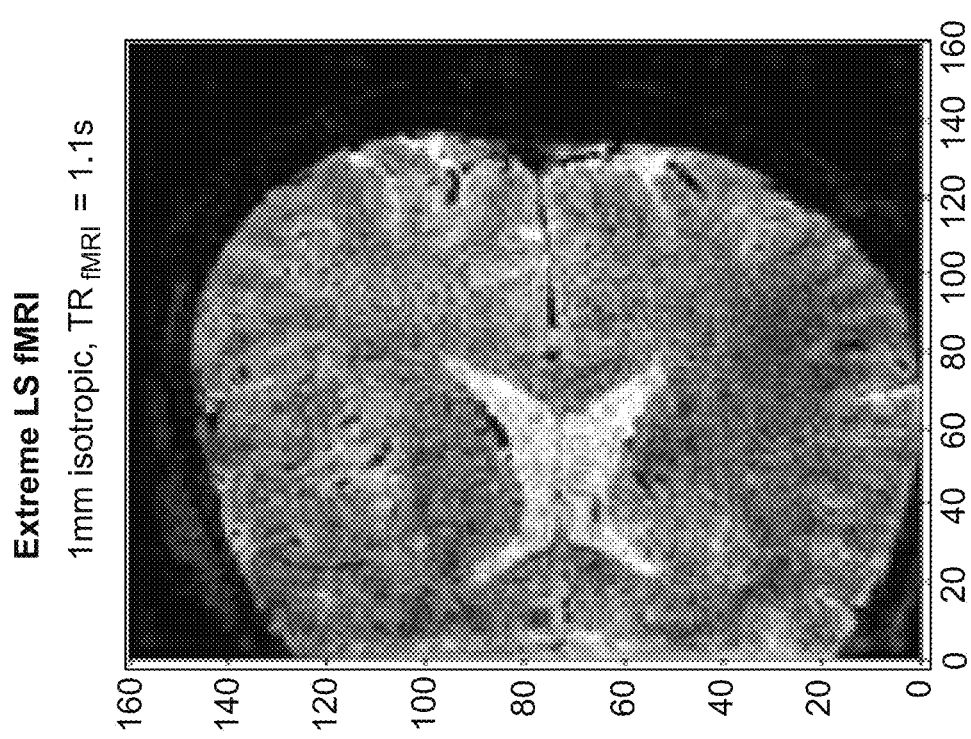
FIG. 6E is an enlarge view of the image shown in FIG. 5E.

FIG. 4F shows a comparison of the k-space trajectory 410 for the pulse sequence 302-3 and the k-space trajectory 412 for the pulse sequence 302. The pulse sequence described herein may be referred to as a Looping Start pulse sequence. The Looping Star pulse sequence uses a time-multiplexed gradient refocusing scheme to produce gradient echoes (GREs) of originally excited FID signals. The acquisition is divided into segments, where each segment encodes a plane in k-space, similar to shots in multi-shot EPI. Multiple segments, rotated by the described golden-angle scheme, are acquired for full 3D k-space coverage. For the pulse sequence 302, in the first loop of a segment, a number of coherences are produced and encoded along different center-out radial spokes with an effective TE=0. The same gradient waveform is then repeated, but without application of RF pulses, to refocus the magnetization in a loop and produce gradient echoes. Since the magnetization is refocused in a continuous loop, the change in the gradient direction and thus acoustic noise is kept small and even further reduced by distributing the gradient updates along the spokes, which results in a relatively circular looping without abrupt edges. In order for the FID signals to refocus, the k-space spokes of the first loop cumulate towards a closed loop and then are identically repeated for one or more subsequent refocusing GRE loops.

The Looping Star sequence 302-3 only requires half as many excitations, and hence generates only half as many coherences, as the sequence 302. The effective k-space encoding by full diameter spokes versus by center-out spokes is the same, except for the FID signals where the center-in parts are missing.

The Looping Star pulse sequence 302 suffers from mixing of the inwards refocusing and outwards dephasing signals, known as echo-in/echo-out mixing. These signals may be separated through k-space filtering or RF phase cycling, but at the expense of reduced image quality, or increased scan time. The Looping Star pulse sequence 302-3 resolves echo-in/echo-out mixing by separating the RF excitations in time and thereby acquiring full diameters spokes (without overlapping coherences) during the refocusing.

The number of spokes per loop or per segment (SPL) is a parameter to consider in a Looping Star sequence. A higher SPL produces lower acoustic noise but increases the echo time given by TE=SPL*TG with TG as the duration of the flat part of the gradients. The acquisition time for a volume (Tacq), equivalent to the TR in an fMRI experiment, is given by Tacq=(TG*SPL*NLoops+2*Tramp)*NSeg, where NLoops is the number of loops, i.e. number of echoes plus the FID, and NSeg is the number of segments which is determined by the level of undersampling in the acquisition. Gradient ramp-up time (Tramp) is typically between 2-5 ms to provide silent operation.

After a functional MR dataset is acquired 202, MR images are reconstructed 206 based on the dataset. The functional dataset acquired has a very large data size, and renders the reconstruction process extremely slow. To reduce the computation load and memory required, a MSLR reconstruction framework is used in the system and methods disclosed herein. A stochastic optimization may be used to further reduce the computation load and memory required.

Concretely, let T be the number of frames, N be the image size, and J be the number of scales for MSLR. And for scale $j=1, \ldots, J$, let $N_j$ be the block size, $B_j$ be the number of blocks and $K_j$ be the maximum block matrix rank. Then for each block $b=1, \ldots, B_j$, define $L_{jb} \in \mathbb{C}^{N_j \times K_j}$ be the block spatial bases, $R_{jb} \in \mathbb{C}^{T \times K_j}$ be the block temporal bases, $M_{jb} \in \mathbb{C}^{N \times N_j}$ a linear operator that embeds the input block matrix to the full image. The volumetric spatiotemporal matrix $X \in \mathbb{C}^{N \times T}$ is represented as:

$$X = \sum_{j=1}^{J} \sum_{b=1}^{B_j} M_{jb} L_{jb} R_{jb}^H. \tag{5}$$

For notation simplicity, stacked spatial and temporal bases $L_{jb} \in \mathbb{C}^{N_j B_j \times K_j}$ and $R_{jb} \in \mathbb{C}^{TB_j \times K_j}$ respectively, and a linear operator $M_j$: $\mathbb{C}^{N_j B_j \times TB_j} \to \mathbb{C}^{N \times T}$ that embeds the stacked input to an image are considered such that $$X = \sum_{j=1}^{J} M_j(L_j R_j^H). \tag{6}$$

Multichannel MRI acquisition systems have C coil channels and the overall scan is divided into T frames. It is assumed the underlying image for each frame is approximately static for fine enough temporal resolution. That is, view sharing with short non-overlapping time windows is considered. Let M be the number of measurements for each frame, $A: \mathbb{C}^{N \times T} \to \mathbb{C}^{MC \times T}$ be the overall sensing linear operator, which incorporates sensitivity maps and non-uniform Fourier sampling, and $W \in \mathbb{C}^{MC \times T}$ represent the complex white Gaussian acquisition noise. Then, the k-space measurement matrix $Y \in \mathbb{C}^{MC \times T}$ is given by:

$$Y = A(X) + W. \tag{7}$$

Since the number of measurements is vastly smaller than the total dynamic image size, the reconstruction problem is severely underdetermined. The problem may be solved by using an incoherent sampling acquisition, a sparsifying signal representation, and a non-linear algorithm for underdetermined MRI reconstruction. Following this structure, intrinsic 3D non-Cartesian trajectories are leveraged, such as 3D radial, 1 and 3D cones, with ordering that incoherently cover time and k-space over the entire acquisition. As for the underlying model, MSLR is used for compactly representing the underlying volumetric image sequence. The overall forward model is then given by:

$$Y = A(\sum_{j=1}^{J} M_j(L_j R_j^H)) + W. \tag{8}$$

With the forward model, one way to impose low-rank constraints is through convex relaxation by minimizing the nuclear norm, or equivalently the sum of singular values. In particular, let $\|X\|_*$ denote the nuclear norm of a matrix X. Then for each scale j, let $\lambda_j$ be the regularization parameter and $\|X\|_{(j)} = \sum_{b=1}^{B_j} \|M_{jb}^H X\|_*$ denote the block-wise nuclear norm, the convex formulation considers the objective function, $$f(x) = \frac{1}{2} \|Y - A(\sum_{j=1}^{J} M_j(X_j))\|_2^2 + \sum_{j=1}^{J} \lambda_j \|X_j\|_{(j)}. \tag{9}$$

Under the identity setup and certain idealized incoherent conditions on the basis vectors, MSLR decomposition can be recovered when $\{\lambda_j\}_{j=1}^{J}$ are chosen such that $$\lambda_j \propto \sqrt{N_j} + \sqrt{T} + \sqrt{2 \log B_j}. \tag{10}$$

This relationship is useful because tuning one scaling parameter is only needed, instead of J regularization parameters. In some embodiments, $\{\lambda_j\}_{j=1}^{J}$ is chosen following Eq. (10). However, a downside of the convex formulation is that it uses significant amount of memory. This is because full sized spatiotemporal matrices are stored even when they are extremely low rank. In particular, for an image size of for example 320×320×320 and 500 frames, merely storing the image in complex single precision floats requires 125 GBs.

Applying iterative algorithms would require a few times more memory for workspace, which can approach terabytes. Local workstations, or even computing clusters, have difficulties handling such memory demand.

Rather than minimizing the convex problem in Eq. 9, the Burer-Monteiro factorization is considered to directly solve for the compressed representation. It considers the following non-convex transformation, $$\|X\|_* = \min_{X=LR^H} \frac{1}{2}(\|L\|_F^2 + \|R\|_F^2), \quad (11)$$

and minimizes the following equivalent objective function:

$$f(L, R) = \frac{1}{2}\left\|Y - A\left(\sum_{j=1}^{J} M_j(L_j R_j^H)\right)\right\|_2^2 + \sum_{j=1}^{J} \frac{\lambda_j}{2}(\|L\|_F^2 + \|R\|_F^2). \quad (12)$$

The primary benefit of this formulation is that it can use significantly less memory for low-rank matrices. For a typical 3D volume, the variables can even fit the variables in GPUs. However, the main drawback is that the problem becomes non-convex. Nonetheless, in practice, applying first-order gradient methods on the non-convex objective function reaches decent solutions.

Before moving to the algorithm, the proposed formulation can easily incorporate priors of the temporal dynamics, such as smoothness. For example, given a finite difference operator $D \in \mathbb{C}^{T-1 \times T}$, the above objective function can be modified to enforce temporal smoothness as follows:

$$f(L, R) = \frac{1}{2}\left\|Y - A\left(\sum_{j=1}^{J} M_j(L_j R_j^H)\right)\right\|_2^2 + \sum_{j=1}^{J} \frac{\lambda_j}{2}(\|L\|_F^2 + \|DR_j\|_F^2). \quad (13)$$

Even with the explicit LR factorization, performing conventional iterative reconstruction is still prohibitively slow, requiring computing many non-uniform fast Fourier transformations (NUFFTs) per iteration, one for each time frame and channel. To address this issue, stochastic optimization techniques are applied to accelerate the reconstruction, which update variables in each iteration with random subsets of measurements.

The idea of using subsets of measurements for iterative updates using stochastic optimization or stochastic gradient decent (SGD) can transform an almost computationally infeasible reconstruction to a practical one. For example, the amount of memory required may be reduced from 125 GB for a functional dataset of matrix size of 320×320×320 and having 500 frames to less than 12 GB, allowing GPU-accelerated large-scale reconstruction on consumer GPUs.

In particular, split the objective function into separate frames and coils, $$f_{tc}(L, R) = \frac{1}{2}\left\|Y_{tc} - A_{tc}\left(\sum_{j=1}^{J} M_j(L_j R_{jt}^H)\right)\right\|_2^2 + \sum_{j=1}^{J} \frac{\lambda_j}{2}\left(\frac{1}{TC}\|L_j\|_F^2 + \frac{1}{C}\|DR_j\|_F^2\right), \quad (14)$$

for t=1, . . . , T and c=1, . . . , C, then $f(L,R) = \sum_{t=1}^{T} \sum_{c=1}^{C} f_{tc}(L,R)$.

In each iteration, SGD randomly selects a frame t and a coil c, and performs the following updates:

$$L = L - \alpha TC \nabla_L f_{tc}(L,R)$$

$$R_t = R_t - \alpha C \nabla_{R_t} f_{tc}(L,R), \quad (15)$$

where α is a step-size parameter. In one embodiment, to choose the step-size α, the step-size α is first set as 1, and the iteration updates are run. If the iteration diverges with the gradient norm reaching a numerical limit, the reconstruction is restarted and the step-size α is halved.

With SGD, the number of NUFFTs per iteration is drastically reduced to 1. Moreover, SGD can easily support parallel processing by performing mini-batch updates. Given G parallel processors, such as multiple GPUs, each processor g can choose a different frame t and a different coil c, calculate the gradients $\nabla_L f_{tc}(L,R)$ and $\nabla_{R_t} f_{tc}(L,R)$, and additively synchronize afterward Concretely, in each iteration, SGD randomly selects an index set I={(t$_1$,c$_1$), (t$_2$,c$_2$), . . . , (t$_G$, c$_G$)}. Then, SGD performs:

$$L = L - \frac{\alpha TC}{G} \sum_{(t,c) \in I} \nabla_L f_{tc}(L, R) \quad (16)$$

$$R_t = R_t - \frac{\alpha C}{G} \Sigma_{c:(t,c) \in I} \nabla_{R_t} f_{tc}(L, R)$$

for all t such that (t,c)∈I, where only the summations are synchronized across the processors, thus minimizing expensive communications. In one example, the regularization parameter λ is $10^{-12}$, and the maximum number of iterations is 10.

The above described methods and systems may be applied in reconstructing anatomical images, with the number of frames set to 1. A frame of k-space datasets may be chosen from the functional MR datasets and be expanded as a sum of the MSLR bases.

In the exemplary embodiment, to further reduce the computation load and memory requirement, functional MR images are expanded with a smaller set of low-rank bases than the MSLR bases for reconstruction of anatomical images. A frame of functional images x are expressed as:

$$x = x_{anatomical} + \pi_F X_i, \quad (17)$$

where $x_{anatomical}$ is anatomical images, and $X_i$'s are a smaller set of low-rank bases than those for the anatomical image. The number of bases $X_i$'s may be empirically determined. The low-rank bases for functional images represent temporal changes of the subject during the fMRI scan. In one example, the regularization parameter λ is $10^{-2}$.

FIGS. 5A-6F show results of fMRI studies. FIG. 5A is an anatomical image, and FIG. B shows functional maps of the brain, using fMRI datasets acquired with a known method where the segments of k-space is not pseudo-randomized. FIGS. 5C and 5E are anatomical images, and FIGS. 5D and 5F are functional maps of the brain, using fMRI datasets acquired with the systems and methods disclosed herein. The image in FIG. 5E has a higher image resolution of isotropic 1 mm$^3$, compared to the resolution of isotropic 3×3×3 mm$^3$ for the image shown in FIG. 5C. FIGS. 6A-6F are enlarged views of FIGS. 5A-5F, respectively.

Contrast to the image 502 in FIG. 5A acquired with a known method, the artifacts 503 in the images 504, 506 shown in FIGS. 5C and 5E are largely reduced to a negligible level. In the systems and methods disclosed herein, a 3D k-space volume is pseudo-randomly sampled by the segments of k-space. As a result, artifacts and noise are pseudo-randomly dispersed in the acquired MR signals, and therefore are largely reduced. Further, although the image 502 are acquired with same image resolution of 3×3×3 mm$^3$ as the image 504, the image quality of the image 504 is noticeably better than that of the image 502, showing details like vessels 508. The systems and methods disclosed herein sample the 3D k-space volume uniformly, especially the periphery of the k-space volume, which includes information of high spatial-frequencies, i.e., spatial details. Similarly, the functional maps shown in FIGS. 5D and 5F have a much higher SNR and better image resolution than those shown in FIG. 5B.

In addition, the vessels 508 and blood therein in images 504, 506 are black. Black-blood is advantageous for fMRI. The basis of fMRI is the BOLD effect in the brain tissue. MR signals are not directly sensitive to the neural activity. Instead, the MR signal changes are an indirect effect related to the changes in blood flow that follow the changes in neural activity. When neural activity increases, blood flow increase and the oxygenation level in the blood increases. Oxygen-rich blood has different magnetic susceptibility than oxygen-poor blood due to the hemoglobin binding oxygen in blood, and therefore has different level of MR signals. When large vessels appear black in MR images where the signals from large vessels are low, the contamination of the fMRI maps from large vessels is significantly reduced.

The workstation 12 may be any suitable computing device 800 and software implemented therein. The methods 200 and 204 or one or more processes in the methods 200 and 204 may be implemented in any suitable computing device 800. FIG. 7 is a block diagram of an exemplary computing device 800. In the exemplary embodiment, the computing device 800 includes a user interface 804 that receives at least one input from a user. The user interface 804 may include a keyboard 806 that enables the user to input pertinent information. The user interface 804 may also include, for example, a pointing device, a mouse, a stylus, a touch sensitive panel (e.g., a touch pad and a touch screen), a gyroscope, an accelerometer, a position detector, and/or an audio input interface (e.g., including a microphone).

Moreover, in the exemplary embodiment, computing device 800 includes a display interface 817 that presents information, such as input events and/or validation results, to the user. The display interface 817 may also include a display adapter 808 that is coupled to at least one display device 810. More specifically, in the exemplary embodiment, the display device 810 may be a visual display device, such as a cathode ray tube (CRT), a liquid crystal display (LCD), a light-emitting diode (LED) display, and/or an "electronic ink" display. Alternatively, the display interface 817 may include an audio output device (e.g., an audio adapter and/or a speaker) and/or a printer.

The computing device 800 also includes a processor 814 and a memory device 818. The processor 814 is coupled to the user interface 804, the display interface 817, and the memory device 818 via a system bus 820. In the exemplary embodiment, the processor 814 communicates with the user, such as by prompting the user via the display interface 817 and/or by receiving user inputs via the user interface 804. The term "processor" refers generally to any programmable system including systems and microcontrollers, reduced instruction set computers (RISC), complex instruction set computers (CISC), application specific integrated circuits (ASIC), programmable logic circuits (PLC), and any other circuit or processor capable of executing the functions described herein. The above examples are exemplary only, and thus are not intended to limit in any way the definition and/or meaning of the term "processor."

In the exemplary embodiment, the memory device 818 includes one or more devices that enable information, such as executable instructions and/or other data, to be stored and retrieved. Moreover, the memory device 818 includes one or more computer readable media, such as, without limitation, dynamic random access memory (DRAM), static random access memory (SRAM), a solid state disk, and/or a hard disk. In the exemplary embodiment, the memory device 818 stores, without limitation, application source code, application object code, configuration data, additional input events, application states, assertion statements, validation results, and/or any other type of data. The computing device 800, in the exemplary embodiment, may also include a communication interface 830 that is coupled to the processor 814 via the system bus 820. Moreover, the communication interface 830 is communicatively coupled to data acquisition devices.

In the exemplary embodiment, the processor 814 may be programmed by encoding an operation using one or more executable instructions and providing the executable instructions in the memory device 818. In the exemplary embodiment, the processor 814 is programmed to select a plurality of measurements that are received from data acquisition devices.

In operation, a computer executes computer-executable instructions embodied in one or more computer-executable components stored on one or more computer-readable media to implement aspects of the invention described and/or illustrated herein. The order of execution or performance of the operations in embodiments of the invention illustrated and described herein is not essential, unless otherwise specified. That is, the operations may be performed in any order, unless otherwise specified, and embodiments of the invention may include additional or fewer operations than those disclosed herein. For example, it is contemplated that executing or performing a particular operation before, contemporaneously with, or after another operation is within the scope of aspects of the invention.

At least one technical effect of the systems and methods described herein includes (a) silent dynamic imaging; (b) multi-gradient echo acquisition; (c) anatomical and functional images generated from the same functional MR dataset; and (d) pseudo-randomly and uniformly sampling a 3D k-space volume to generate images of reduced artifacts and increase image resolution.

Exemplary embodiments of systems and methods of silent dynamic imaging are described above in detail. The systems and methods are not limited to the specific embodiments described herein but, rather, components of the systems and/or operations of the methods may be utilized independently and separately from other components and/or operations described herein. Further, the described components and/or operations may also be defined in, or used in combination with, other systems, methods, and/or devices, and are not limited to practice with only the systems described herein.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A magnetic resonance (MR) imaging method of dynamically imaging a subject using an MR imaging (MRI) system, comprising:
acquiring a functional MR dataset of a three-dimensional (3D) k-space volume of the subject including a plurality of frames of k-space datasets, while a functional stimulus is applied to the subject, by:
for each of a plurality of repetitions, acquiring a frame of k-space datasets of the 3D k-space volume by:
setting an orientation as an initial angle;
acquiring a free induction decay (FID) dataset by:
applying a sequence of gradients to the subject, each gradient of the sequence of gradients corresponding to a k-space spoke of a sequence of k-space spokes, wherein the sequence of k-space spokes define a k-space segment having the orientation in the 3D k-space volume;
applying one or more radio-frequency (RF) excitation pulses to the subject while the sequence of gradients are applied; and
collecting the FID dataset corresponding to an RF emission from the subject immediately following each RF excitation pulse;
acquiring a gradient echo dataset corresponding to the FID dataset by re-applying the sequence of gradients to the subject while acquiring echoes of the RF emissions to obtain the gradient echo dataset;
updating the orientation as golden angles along which the k-space segment partitions the 3D k-space volume by golden means;
repeating acquiring an FID dataset, acquiring a gradient echo dataset, and updating the orientation until a predetermined condition is met;
and
generating anatomical MR images and functional images based on the functional MR dataset by:
generating anatomical images based on one of the plurality of frames of k-space datasets; and
generating functional MR images based on the functional MR dataset.

2. The method of claim 1, wherein acquiring a gradient echo dataset further comprises acquiring a plurality of gradient echo datasets at a plurality of echo times.

3. The method of claim 1, wherein generating functional MR images further comprises reconstructing a frame of functional MR images at a time point based on a plurality of FID datasets and a plurality of gradient echo datasets acquired within a time interval before and after the time point.

4. The method of claim 1, wherein generating anatomical images further comprises reconstructing anatomical images based on one of the plurality of frames of k-space datasets by expanding one of the plurality of frames of k-space datasets as a sum of multi-scale low-rank matrices.

5. The method of claim 1, wherein generating functional MR images further comprises expanding the plurality of frames of k-space datasets as a sum of multi-scale low-rank matrices.

6. The method of claim 5, wherein the functional MR dataset is acquired by a plurality of coils, generating functional MR images further comprising:

separating an objective function into separate frames and separate coils; and
for a plurality of iterations,
stochastically selecting a coil among the plurality of coils and a frame among a plurality of frames; and
optimizing the objective function for the selected coil and the selected frame.

7. The method of claim 5, wherein generating functional MR images further comprises:
reconstructing functional MR images by expanding a difference k-space dataset as a sum of multi-scale low-rank matrices indicating temporal changes, wherein the difference k-space dataset includes a difference between a first frame of k-space datasets at a first time point and a second frame of k-space datasets at a second time point adjacent the first time point.

8. The method of claim 1, wherein:
applying one or more RF excitation pulses further comprises applying one RF excitation pulse while two gradients corresponding to two k-space spokes are applied sequentially to each other.

9. The method of claim 1, wherein:
applying a sequence of gradients further comprises applying the sequence of gradients, each gradient in the sequence corresponding to a k-space spoke extending from a first periphery of a k-space, passing through a center of the k-space, and extending to a second periphery of the k-space opposite the first periphery; and
applying one or more RF excitation pulse further comprises applying an RF excitation pulse to the subject when the center of the k-space is scanned by each gradient.

10. A magnetic resonance (MR) imaging method of dynamically imaging a subject, comprising:
acquiring k-space datasets of a three-dimensional (3D) k-space volume of the subject comprising:
setting an orientation as an initial angle;
acquiring a free induction decay (FID) dataset by:
applying a sequence of gradients to the subject, each gradient of the sequence of gradients corresponding to a k-space spoke of a sequence of k-space spokes, wherein the sequence of k-space spokes define a k-space segment having the orientation in the 3D k-space volume;
applying one or more radio-frequency (RF) excitation pulses to the subject while the sequence of gradients are applied; and
collecting the FID dataset corresponding to an RF emission from the subject immediately following each RF excitation pulse;
acquiring a gradient echo dataset corresponding to the FID dataset by re-applying the sequence of gradients to the subject while acquiring echoes of the RF emissions to obtain the gradient echo dataset;
updating the orientation as golden angles along which the k-space segment partitions the 3D k-space volume by golden means; and
repeating acquiring an FID dataset, acquiring a gradient echo dataset, and updating the orientation until a predetermined condition is met.

11. The method of claim 10, wherein acquiring a gradient echo dataset further comprises acquiring a plurality of gradient echo datasets at a plurality of echo time.

12. The method of claim 10, further comprising:
acquiring a functional MR dataset by:
repeating acquiring the 3D k-space volume for a predetermined number of repetitions while a functional stimulus is applied to the subject.

13. The method of claim 12, further comprising:
generating anatomical images based on the functional MR dataset.

14. The method of claim 12, further comprising:
generating functional MR images based on the functional MR dataset.

15. The method of claim 14, wherein generating functional MR images further comprises reconstructing a frame of functional MR images at a time point based on a plurality of FID datasets and a plurality of gradient echo datasets acquired within a time interval before and after the time point.

16. The method of claim 14, wherein generating functional MR images further comprises reconstructing functional MR images based on the functional MR dataset by expanding the functional MR dataset as a sum of multi-scale low-rank matrices.

17. The method of claim 16, wherein the functional MR dataset is acquired by a plurality of coils and comprises a plurality of frames of k-space datasets, reconstructing functional MR images further comprising:
separating an objective function into separate frames and separate coils; and
for a plurality of iterations,
stochastically selecting a coil among the plurality of coils and a frame among a plurality of frames; and
optimizing the objective function for the selected coil and the selected frame.

18. The method of claim 14, wherein generating functional MR images further comprises:
reconstructing a frame of functional MR images by expanding a difference k-space dataset as a sum of multi-scale low-rank matrices indicating temporal changes, wherein the difference k-space dataset includes a difference between a first frame of k-space datasets at a first time point and a second frame of k-space datasets at a second time point adjacent the first time point.

19. The method of claim 10, wherein:
applying one or more RF excitation pulses further comprises applying one RF excitation pulse while two gradients corresponding to two k-space spokes are applied sequentially to each other.

20. The method of claim 10, wherein:
applying a sequence of gradients further comprises applying the sequence of gradients, each gradient in the sequence corresponding to a k-space spoke extending from a first periphery of a k-space, passing through a center of the k-space, and extending to a second periphery of the k-space opposite the first periphery; and
applying one or more RF excitation pulse further comprises applying an RF pulse to the subject when the center of the k-space is scanned by each gradient.

* * * * *

UNITED STATES PATENT AND TRADEMARK OFFICE
CERTIFICATE OF CORRECTION

PATENT NO. : 11,550,013 B2  
APPLICATION NO. : 17/038698  
DATED : January 10, 2023  
INVENTOR(S) : Florian Wiesinger et al.

Page 1 of 1

It is certified that error appears in the above-identified patent and that said Letters Patent is hereby corrected as shown below:

On the Title Page

In item (73), in Assignee, after "GE PRECISION HEALTHCARE LLC, Wauwatosa, WI (US)" insert therefor -- THE REGENTS OF THE UNIVERSITY OF CALIFORNIA, Oakland, CA (US) --.

Signed and Sealed this  
Twenty-seventh Day of May, 2025

Coke Morgan Stewart  
*Acting Director of the United States Patent and Trademark Office*